(12) United States Patent
Kim et al.

(10) Patent No.: US 9,627,514 B1
(45) Date of Patent: Apr. 18, 2017

(54) SEMICONDUCTOR DEVICE AND METHOD OF FABRICATING THE SAME

(71) Applicant: SAMSUNG ELECTRONICS CO., LTD., Suwon-si, Gyeonggi-Do (KR)

(72) Inventors: Dong-Kwon Kim, Gimcheon-si (KR); Ji-Hoon Cha, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/188,619

(22) Filed: Jun. 21, 2016

Related U.S. Application Data

(60) Provisional application No. 62/271,684, filed on Dec. 28, 2015.

(51) Int. Cl.
 *H01L 29/66* (2006.01)
 *H01L 29/78* (2006.01)
 *H01L 21/768* (2006.01)

(52) U.S. Cl.
 CPC .... *H01L 29/66795* (2013.01); *H01L 21/7682* (2013.01); *H01L 21/76897* (2013.01); *H01L 29/6653* (2013.01); *H01L 29/785* (2013.01)

(58) Field of Classification Search
 CPC ............... H01L 29/66; H01L 29/6653; H01L 29/66795; H01L 29/78; H01L 29/785; H01L 21/76; H01L 21/7682; H01L 21/76897
 USPC ......................................................... 257/401
 See application file for complete search history.

(56) References Cited

U.S. PATENT DOCUMENTS

| | | | |
|---|---|---|---|
| 7,838,373 B2 | 11/2010 | Giles et al. | |
| 8,952,452 B2 | 2/2015 | Kang et al. | |
| 9,190,486 B2 | 11/2015 | Xie et al. | |
| 2011/0309416 A1 | 12/2011 | Yamashita et al. | |
| 2015/0187644 A1 | 7/2015 | Kim | |
| 2015/0243544 A1 | 8/2015 | Alptekin et al. | |
| 2015/0255571 A1 | 9/2015 | Xu et al. | |
| 2016/0087053 A1* | 3/2016 | Kim .................. H01L 29/41783 257/369 |

FOREIGN PATENT DOCUMENTS

| | | |
|---|---|---|
| JP | 2010-157588 | 7/2010 |
| KR | 10-2001-0011638 | 2/2001 |
| KR | 10-2015-0081738 | 7/2015 |

* cited by examiner

*Primary Examiner* — Monica D Harrison
(74) *Attorney, Agent, or Firm* — F. Chau & Associates, LLC

(57) ABSTRACT

A method of fabricating a semiconductor device is provided as follows. Epitaxial layers is formed on an active fin structure of a substrate. First metal gate electrodes are formed on the active fin structure. Each first metal gate electrode and each epitaxial layer are alternately disposed in a first direction on the active fin structure. ILD patterns are formed on the epitaxial layers, extending in a second direction crossing the first direction. Sacrificial spacer patterns are formed on the first metal gate electrodes. Each of the plurality of sacrificial spacer patterns covers a corresponding first metal gate electrode of the first metal gate electrodes. Self-aligned contact holes and sacrificial spacers are formed by removing the ILD patterns. Each self-aligned contact hole exposes a corresponding epitaxial layer disposed under each ILD pattern. Source/drain electrodes are formed in the self-aligned contact holes. The sacrificial spacers are replaced with air spacers.

20 Claims, 47 Drawing Sheets

SEMICONDUCTOR DEVICE AND METHOD OF FABRICATING THE SAME

CROSS-REFERENCE TO RELATED APPLICATION

This application claims the benefit under 35 U.S.C. §119 (e) to U.S. Provisional Patent Application No. 62/271,684, filed on Dec. 28, 2015 in the United States Patent & Trademark Office, the disclosure of which is incorporated by reference herein in its entirety.

TECHNICAL FIELD

The present inventive concept relates to a method of fabricating a semiconductor device.

DISCUSSION OF RELATED ART

For higher densities in integrated circuit applications, fabrication processes have evolved to reduce the minimum feature sizes of circuit elements such as the gate electrode and source/drain electrodes of transistors. As the feature sizes have decreased, distances between the circuit elements also reduce, and thus electrical shorts between the circuit elements may occur according to process variations of the fabrication processes.

SUMMARY

According to an exemplary embodiment of the present inventive concept, a method of fabricating a semiconductor device is provided as follows. An active fin structure and an isolation region are formed on a substrate. Epitaxial layers is formed on the active fin structure. First metal gate electrodes are formed on the active fin structure. Each first metal gate electrode and each epitaxial layer are alternately disposed in a first direction on the active fin structure. ILD patterns are formed on the epitaxial layers. Each ILD pattern is extended in a second direction crossing the first direction. Sacrificial spacer patterns are formed on the first metal gate electrodes. Each of the plurality of sacrificial spacer patterns covers a corresponding first metal gate electrode of the plurality of first metal gate electrodes. Self-aligned contact holes and sacrificial spacers are formed by removing the ILD patterns. Each self-aligned contact hole exposes a corresponding epitaxial layer disposed under each of the plurality of ILD patterns. Source/drain electrodes are formed in the self-aligned contact holes. The sacrificial spacers are replaced with air spacers.

According to an exemplary embodiment of the present inventive concept, a method of fabricating a semiconductor device is provided as follows. An active fin structure and an isolation region are formed on a substrate. A plurality of first preliminary gate spacers is formed on the isolation region. A plurality of second preliminary gate spacers is formed on the active fin structure. A plurality of epitaxial layers is formed on the active fin structure. Each of the plurality of epitaxial layers is interposed between two adjacent second preliminary gate spacers of the plurality of second preliminary gate spacers. A plurality of dummy gate electrodes including a first dummy gate electrode is formed on the isolation region and second and third dummy gate electrodes on the active fin structure. The first dummy gate electrode is interposed between a first pair of the plurality of first preliminary gate spacers. The second dummy gate electrode is interposed between a second pair of one of the plurality of first preliminary gate spacers and one of the plurality of second preliminary gate spacers. The third dummy gate electrode is interposed between a third pair of the plurality of second preliminary gate spacers. The plurality of first preliminary gate spacers is removed. A plurality of dummy gate spacers is formed from the plurality of second preliminary gate spacers. The plurality of dummy gate spacers is replaced with a plurality of air spacers.

According to an exemplary embodiment of the present inventive concept, a semiconductor device is provided as follows. A substrate has an active fin structure extending in a first direction. First and second metal gate electrodes are disposed on the active fin structure. A source/drain electrode is disposed between the first and second metal gate electrodes and disposed on the active fin structure. An upper surface of the source/drain electrode has a first width and a lower surface of the source/drain electrode has a second width smaller than the first width. A first air spacer is interposed between a first sidewall of the source/drain electrode and the first metal gate electrode. A second air spacer is interposed between a second sidewall of the source/drain electrode and the second metal gate electrode. The first air spacer and the second air spacer are extended in a second direction crossing the first direction.

BRIEF DESCRIPTION OF DRAWINGS

These and other features of the present inventive concept will become more apparent by describing in detail exemplary embodiments thereof with reference to the accompanying drawings of which:

FIGS. 2A to 12A show plan views of the semiconductor device formed according to the flowchart of FIG. 1;

FIGS. 2B to 12B show cross-sectional views taken along X-X' of FIGS. 2A to 12A;

FIGS. 14A to 23A show plan views of the semiconductor device formed according to the flowchart of FIG. 13;

FIGS. 14B to 23B show cross-sectional views taken along X-X' of FIGS. 14A to 24A;

Figure 1:
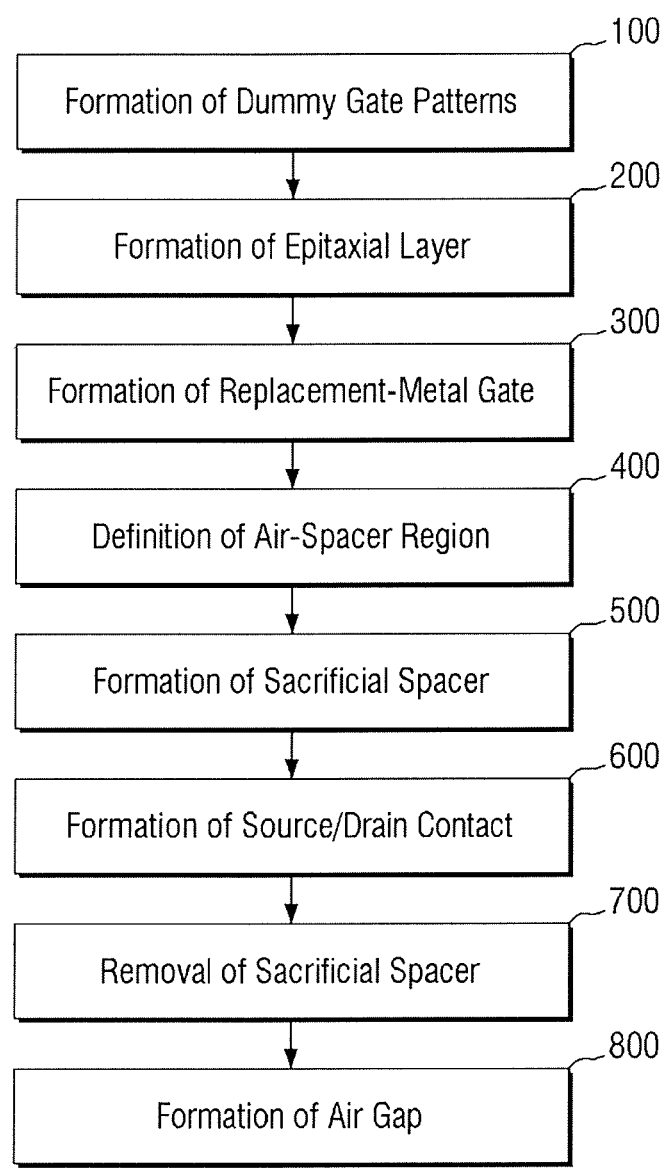
FIG. 1 is a flowchart of fabricating a semiconductor device according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Hereinafter, a method of fabricating a semiconductor device will be described with reference to FIG. 1, FIGS. 2A to 12A, and FIGS. 2B to 12B. FIG. 1 is a flowchart of fabricating a semiconductor device according to an exemplary embodiment of the present inventive concept. FIGS. 2A to 12A show plan views of the semiconductor device formed according to the flowchart of FIG. 1. FIGS. 2B to 123 show cross-sectional views taken along X-X' of FIGS. 2A to 12A. For example, the semiconductor device may include a transistor having an air spacer between a gate electrode and a source/drain electrode. The air spacer may serve as an electrical isolation between the gate electrode and the source/drain electrode.

Figure 2A:
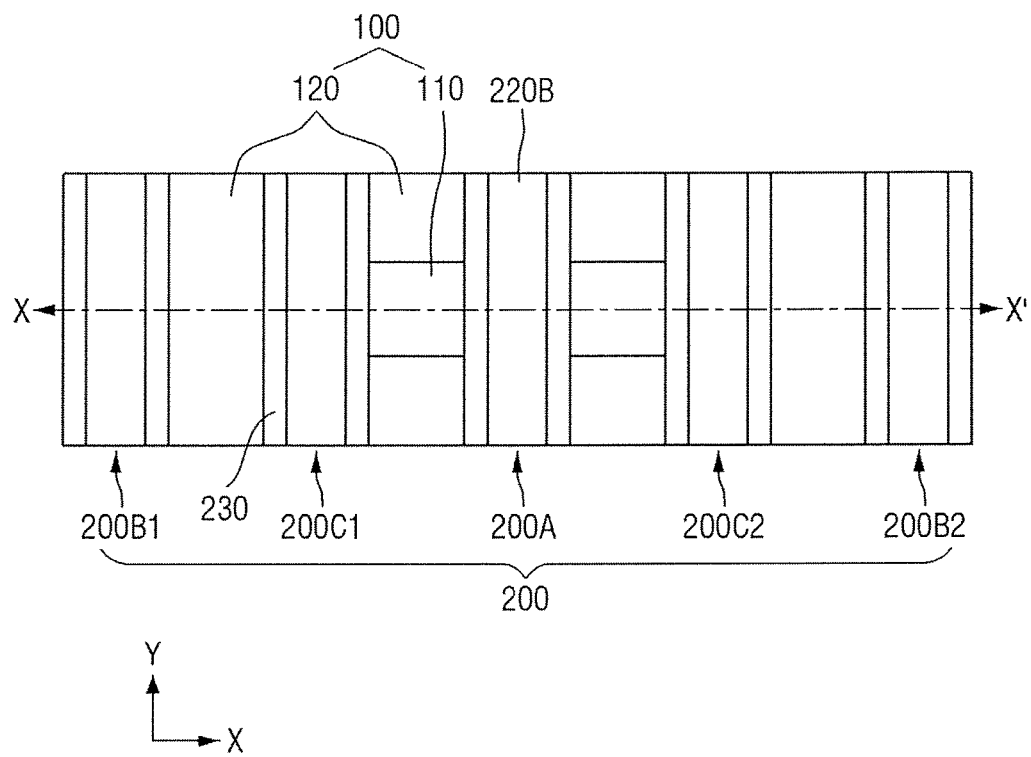
Figure 2B:
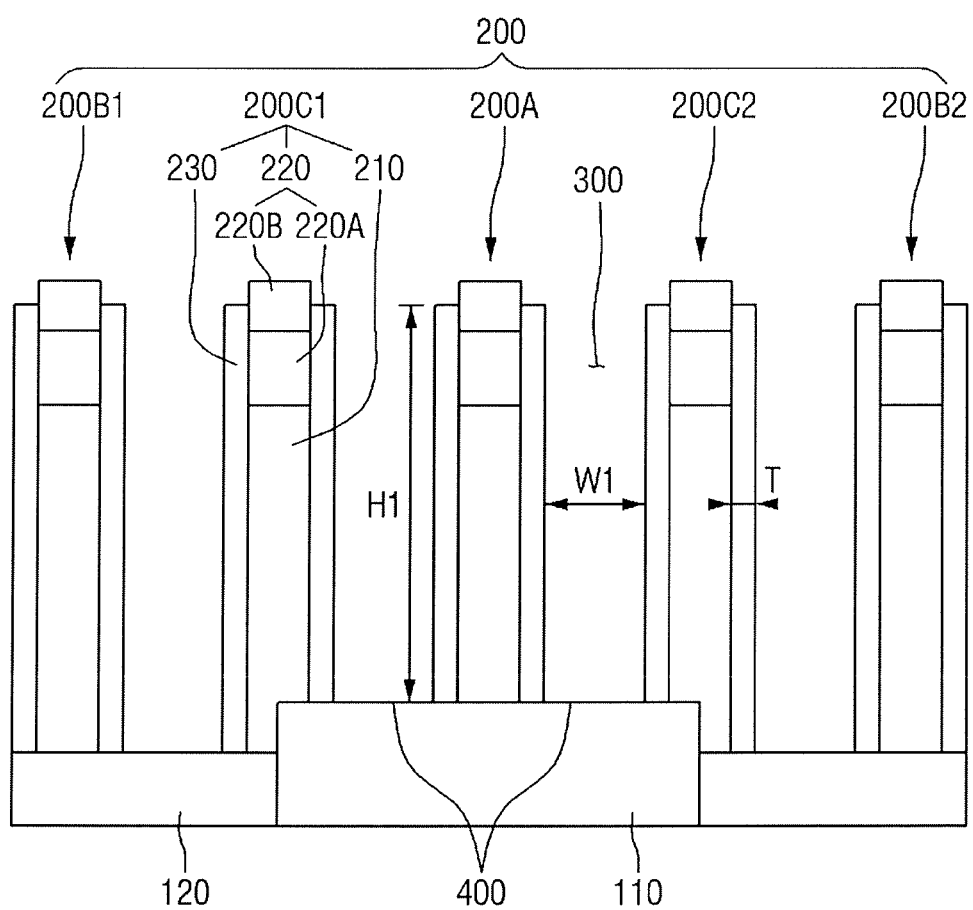

FIG. 2A is a plan view of a plurality of dummy gate patterns formed on a substrate after step 100 of FIG. 1 is performed according to an exemplary embodiment of the present inventive concept. FIG. 2B is a cross-sectional view of FIG. 1A taken along line X-X according to an exemplary embodiment of the present inventive concept.

Referring to FIGS. 2A and 2B, a substrate 100 may be formed of a semiconductor material including silicon or a silicon-germanium alloy. In an exemplary embodiment, the substrate 100 includes an active fin structure 110 and an isolation region 120. The active fin structure 110 protrudes from the isolation region 120. The active fin structure 110 is extended in a first direction (x-axis), and is surrounded by the isolation region 120. An upper surface of the active fin structure 110 is higher than an upper surface of the isolation region 120.

The active fin structure 110 is a part of a transistor and serves to provide a channel region through which a current flows in response to a gate voltage applied to the transistor.

A plurality of dummy gate structures 200 is formed on the substrate 100. The dummy gate structures 200 include a first dummy gate structure 200A. The first dummy gate structure 200A extended in a second direction (y-axis) and crosses the active fin structure 110. A pair of source/drains (not shown here) is formed on both sides of the first dummy gate structure 200A by doping impurity atoms into the contact regions 400 using an ion-implantation process or a diffusion process. The source/drains are formed in the contact regions 400 of the active fin structure 110. In an exemplary embodiment, source/drain contacts and source/drain electrodes will be formed on the source/drains. The first dummy gate structure 200A will become a transistor after performing a fabricating method of a semiconductor device according to an exemplary embodiment.

The dummy gate structures 200 also include second dummy gate structures 200B1 and 200B2 on the isolation region 120. The second dummy gate structures 200B1 and 200B2 do not function as transistors. For the convenience of description, a limited region of a semiconductor device is shown in the drawings. The second dummy gate structures 200B1 and 200B2 may further extend and cross another active fin structure (not shown here). In this case, the overlap region of the second dummy gate structures 200B1 and 200B2 and the another active fin structure may form a transistor.

The dummy gate structures 200 also include third dummy gate structures 200C1 and 200C2 on end portions of the active fin structure 110. The third dummy gate structures 200C1 and 200C2 are formed on boundaries between the active fin structure 110 and the isolation region 120. For example, the dummy gate structures 200 are disposed on both the active fin structure 110 and the isolation region 120.

The third dummy gate structures 200C1 and C2 do not function as transistors. For the convenience of description, a limited region of a semiconductor device is shown in the drawings. The third dummy gate structures 200C1 and 200C2 may further extend and cross another active fin structure (not shown here) to form a transistor.

For the convenience of descriptions, the active fin structure 110 is overlapped with three dummy gate structures 200A, 200C1 and 200C2. The present inventive concept, however, is not limited thereto, and four or more dummy gate structures may overlap the active fin structure 110.

In an exemplary embodiment, each dummy gate structure 200 includes a dummy gate pattern 210, a mask pattern 220 and a preliminary gate spacer 230.

A plurality of trenches 300 is formed between the dummy gate structures 200. For example, the trenches 300 are formed between two adjacent preliminary gate spacers 230.

The dummy gate structures 200 are repeatedly arranged along the first direction in parallel to the x-axis, for example, and are spaced apart from each other in the first direction at a first pitch W1. In an exemplary embodiment, the first pitch W1 is a width of the trench 300. Each dummy gate structure 200 is extended in the second direction in parallel to the y-axis, for example. Each dummy gate structure 200 is erected at a first height H1 on the upper surface of the active fin structure 110 in a third direction in parallel to the z-axis. The first height H1 is a length measured between the upper surface of the active fin structure 110 and the upper surface of the preliminary gate spacer 230.

Each trench 300 is formed between two adjacent dummy gate structures 200 so that each trench 300 is extended in the second direction. In this case, each trench 300 formed on the active fin structure 110 has an aspect ratio of the first pitch W1/the first height H1. The greater is the aspect ratio, the more difficult it is to form a source/drain electrode on the active fin structure 110 through the trench 300.

The dummy gate patterns 210 are formed on the substrate 100. In an exemplary embodiment, the dummy gate patterns 210 may be formed of an amorphous silicon or poly-silicon.

The dummy gate pattern 210 will be replaced with a metal gate electrode using a replacement-metal-gate (RMG) process in a subsequent process.

The mask patterns 220 are formed on upper surfaces of the dummy gate patterns 210. Each mask pattern 220 includes a first mask pattern 220A and a second mask pattern 220B. The first mask pattern 220A is formed on the upper surface of the dummy gate pattern 210. The second mask pattern 220B is formed on an upper surface of the first mask pattern 220A.

In an exemplary embodiment, the mask patterns 220 are used as etch masks to form the dummy gate patterns 210 from a dummy gate layer (not shown here). Before the formation of the dummy gate patterns 210, the dummy gate layer is formed on the substrate 100, covering the substrate 100. In an etching process using the mask patterns 220 as etch masks, the dummy gate layer is patterned into the dummy gate patterns 210. In an exemplary embodiment, the etching process may include a directional etching process including a reactive ion etching (RIE) process.

In an exemplary embodiment, the first mask pattern 220A may be formed of silicon nitride; the second mask pattern 220B may be formed of silicon oxide. The present inventive concept is not limited thereto, and various materials may serve as an etch mask to pattern the dummy gate pattern layer into the dummy gate patterns 210.

The preliminary gate spacers 230 are formed on sidewalls of the dummy gate patterns 210. Each preliminary gate spacer 230 completely covers a sidewall of each dummy gate pattern 210 and a sidewall of each first mask pattern 220A, and partially covers a sidewall of each second mask pattern 220B. In an exemplary embodiment, a preliminary gate spacer layer (not shown here) may be conformally formed on the dummy gate patterns 210 and the mask patterns 220 using a deposition process. The preliminary gate spacer layer may cover completely the dummy gate patterns 210, the mask patterns 220 and the substrate 100. The deposition process may include a chemical vapor deposition (CVD) process. A directional etching process including, for example, an RIE process, may be performed on the preliminary gate spacer layer to form the preliminary gate spacers 230. Due to the directionality of etch gases in the RIE process, the preliminary gate spacers 230 remain on the sidewalls of the dummy gate patterns 210 after the RIE process is completed.

In an exemplary embodiment, the preliminary gate spacers 230 may be formed of SiBCN or SiN.

The preliminary gate spacers 230 have the thickness T to define contact regions 400 of the active fin structure 110. Source/drain electrodes are formed on the contact regions 400 in a subsequent process. The preliminary gate spacers 230 may be replaced with an air spacer in an exemplary embodiment. In this case, a width of the air spacer may be substantially equal to the thickness T of the preliminary gate spacer 230 or less than the thickness T.

The thickness T of each preliminary gate spacer 230 may be also set so that an air spacer is formed between a metal gate electrode and a source/drain electrode in a subsequent process. In an exemplary embodiment, the preliminary gate spacer 230 may be replaced with an air spacer; the dummy gate pattern 210 may be replaced with the metal gate electrode; and the source/drain electrode is formed on the contact region 400. The formation of the air spacers will be described later. The metal gate electrode may be formed in an RMG process which will be described later.

The directions of FIGS. 2A and 2B are applicable to other drawings, unless otherwise specified, and thus the notations of axes x, y and z are omitted on the other drawings.

Figure 3A:
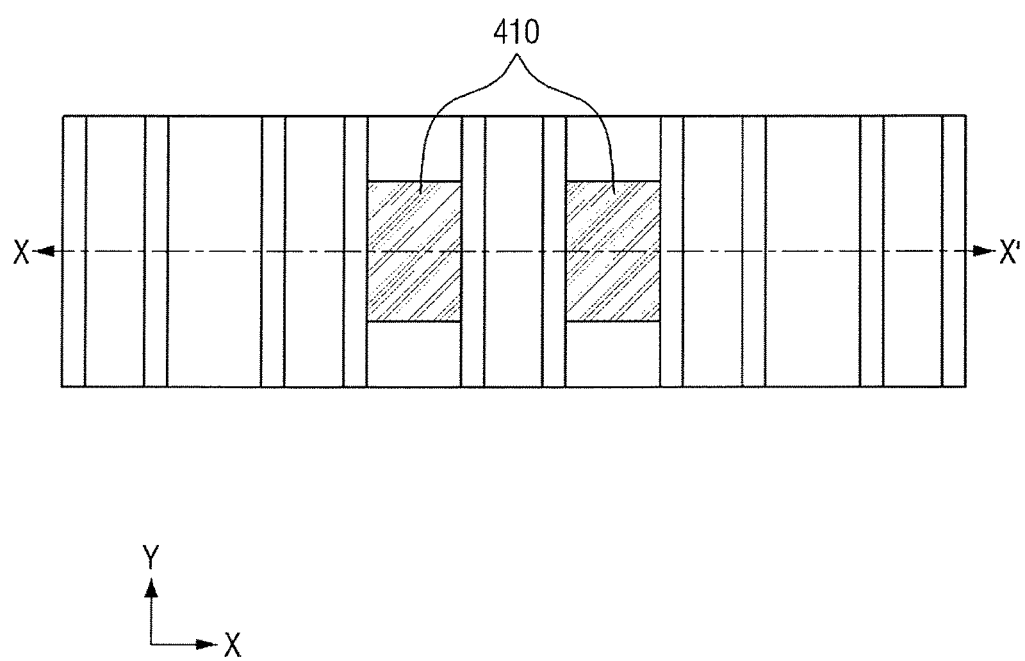
Figure 3B:
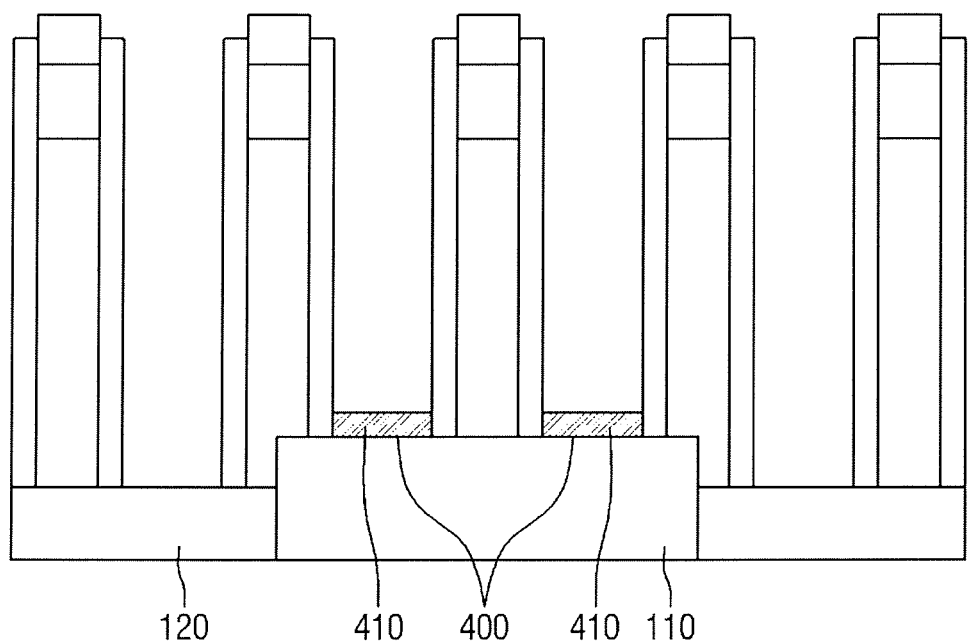

FIGS. 3A and 3B show an epitaxial layer 410 formed on the contact region 400 after step 200 of FIG. 1 is performed according to an exemplary embodiment of the present inventive concept. In an exemplary embodiment, the epitaxial layer 410 may be grown epitaxially using the upper surface of the active fin 110 as a seed layer; an epitaxial layer is not formed on the isolation region 120. In an exemplary embodiment, the isolation region 120 may be formed of silicon oxide, for example. In an exemplary embodiment, impurity atoms may be doped in the epitaxial layer 410 by flowing the impurity atoms with the reactant gases. For example, the reactant gases may include $SiH_4$ or a mixture of $H_2/SiH_4$.

In an exemplary embodiment, the epitaxial layer 410 may be formed of silicon or a silicon germanium (SiGe) alloy. The epitaxial layer 410 may become a silicide contact layer after a silicidation process is performed on the epitaxial layer 410. In the silicidation process, the epitaxial layer 410 may react with a source/drain electrode to be the silicide contact layer. The source/drain electrode may be formed on the epitaxial layer 410 and may be formed of metal. The silicide contact layer may reduce contact resistance between the active fin structure 110 and the source/drain electrode.

Figure 4A:
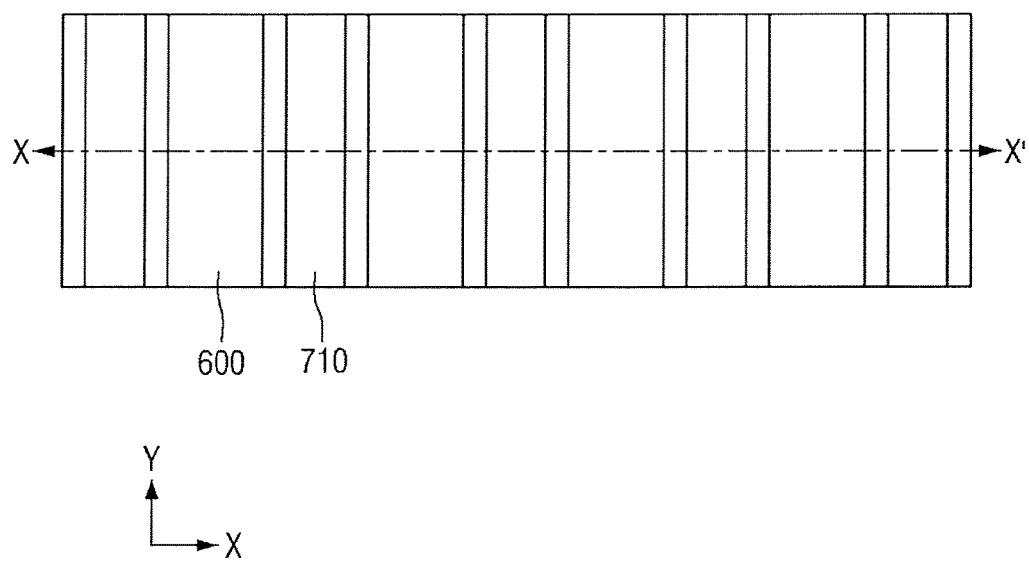
Figure 4B:
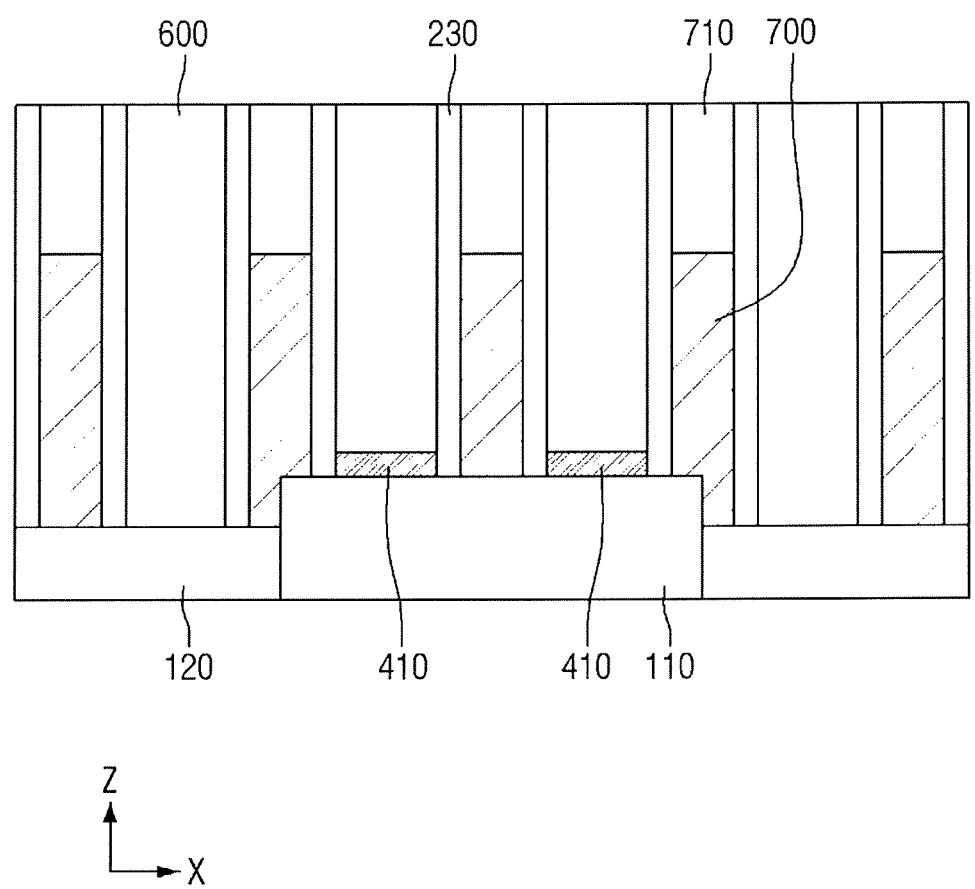

FIGS. 4A and 4B show a plurality of metal gate electrodes 700 formed after step 300 of FIG. 1 is performed according to an exemplary embodiment of the present inventive concept. An RMG process is performed on the resulting structure of FIGS. 3A and 3B. In the RMG process, the first mask patterns 220A and the dummy gate patterns 210 may be removed and then the metal gate electrodes 700 are formed on the substrate 100 in place of the dummy gate patterns 210 of FIG. 3B. Before the RMG process is performed, a plurality of preliminary ILD patterns 600 is formed on the isolation region 120 and the epitaxial layers 410.

In an exemplary embodiment, the metal gate electrodes 700 may be formed of Al, W or Cu.

A plurality of gate electrode caps 710 is formed on upper surfaces of the metal gate electrodes 700. In an exemplary embodiment, the gate electrode caps 710 may be formed of SiBCN or SiN. In an exemplary embodiment, the preliminary gate spacers 230 may be formed of SiBCN or SiN. In an exemplary embodiment, the gate electrode caps 710 and the preliminary gate spacers 230 may be formed of the same material.

Each of the metal gate electrodes 700 and each of the gate electrode caps 710 are interposed between two adjacent preliminary gate spacers 230. The RMG process may be followed by a planarizing process including an etchback process or a chemical-mechanical polishing (CMP) process. In this case, upper surfaces of the gate electrode caps 710, upper surfaces of the preliminary ILD patterns 600 and upper surfaces of the preliminary gate spacers 230 are coplanar with each other.

FIGS. 5A-6A and 5B-6B show a preliminary air spacer region formed after step 400 is performed according to an exemplary embodiment.

Figure 5A:
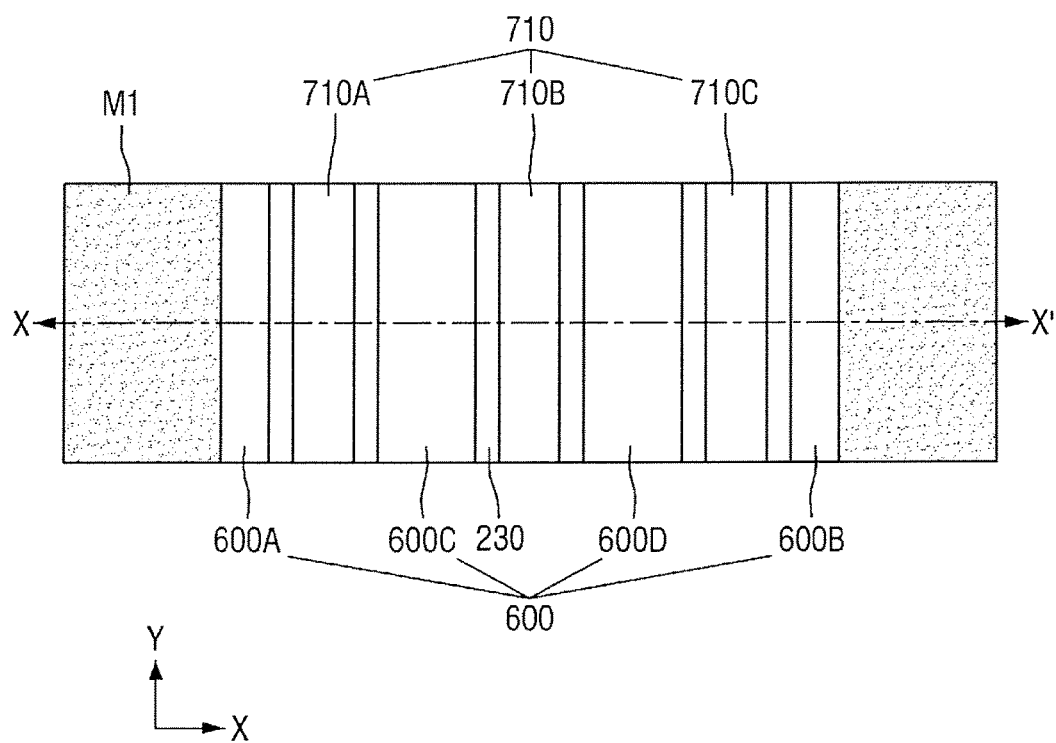
Figure 5B:
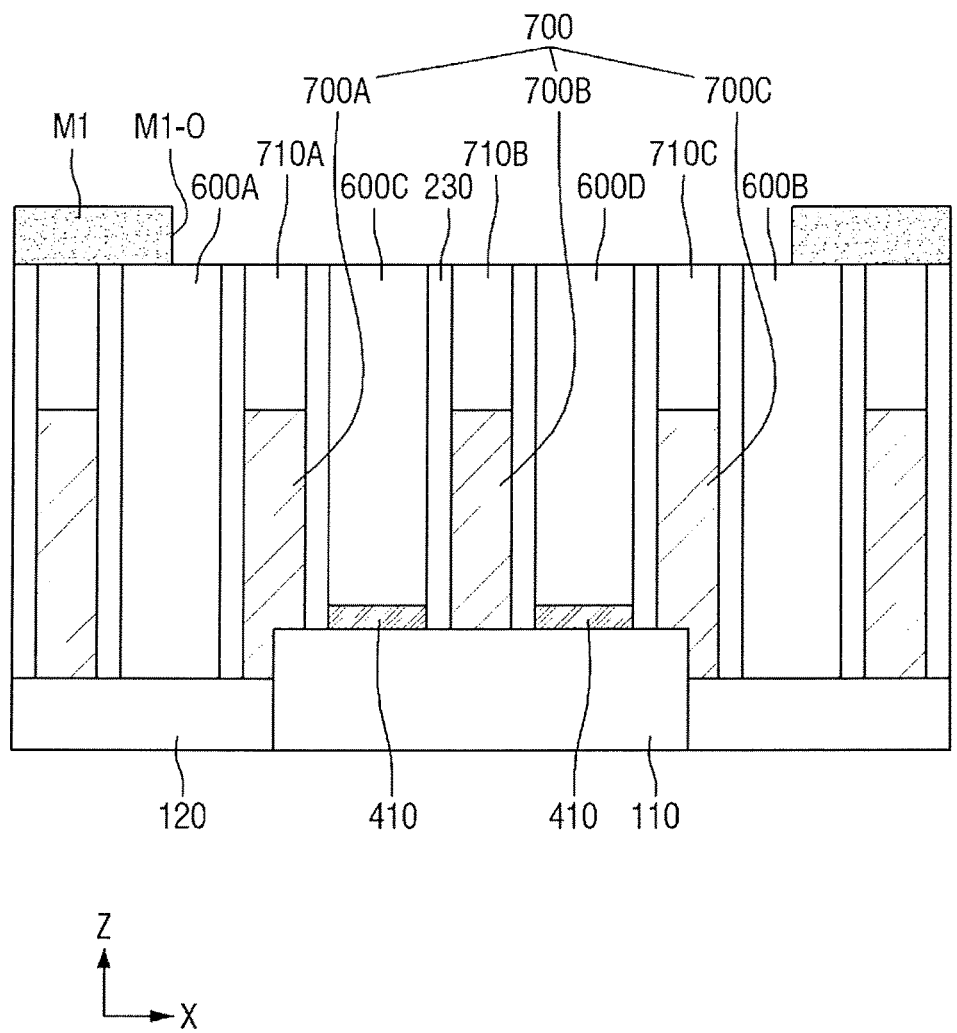

FIGS. 5A and 5B show a first mask M1 formed on the resulting structure of FIGS. 4A and 4B according to step 400 of FIG. 1. In an exemplary embodiment, the first mask M1 includes a mask opening M1-O within which metal gate electrodes 700A, 700B and 700C and the epitaxial layers 410 are disposed. The mask opening M1-O exposes gate electrode caps 710A, 710B and 710C that are formed on the metal gate electrodes 700A, 700B and 700C, respectively.

The mask opening M1-O also exposes preliminary ILD patterns 600C and 600D, and partially exposes preliminary ILD patterns 600A and 600B.

Figure 6A:
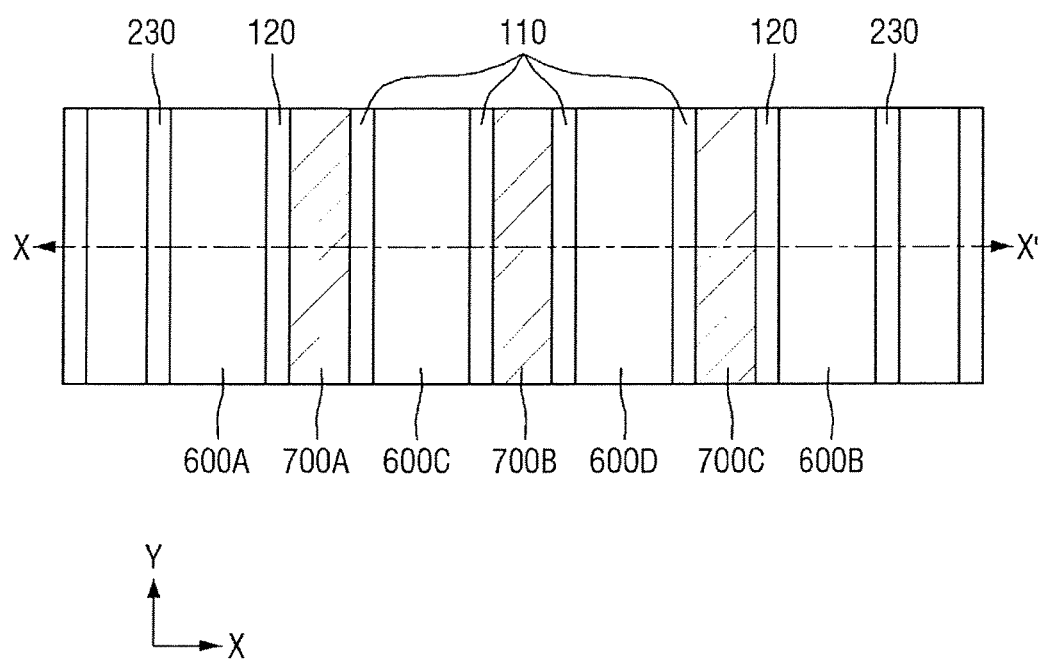
Figure 6B:
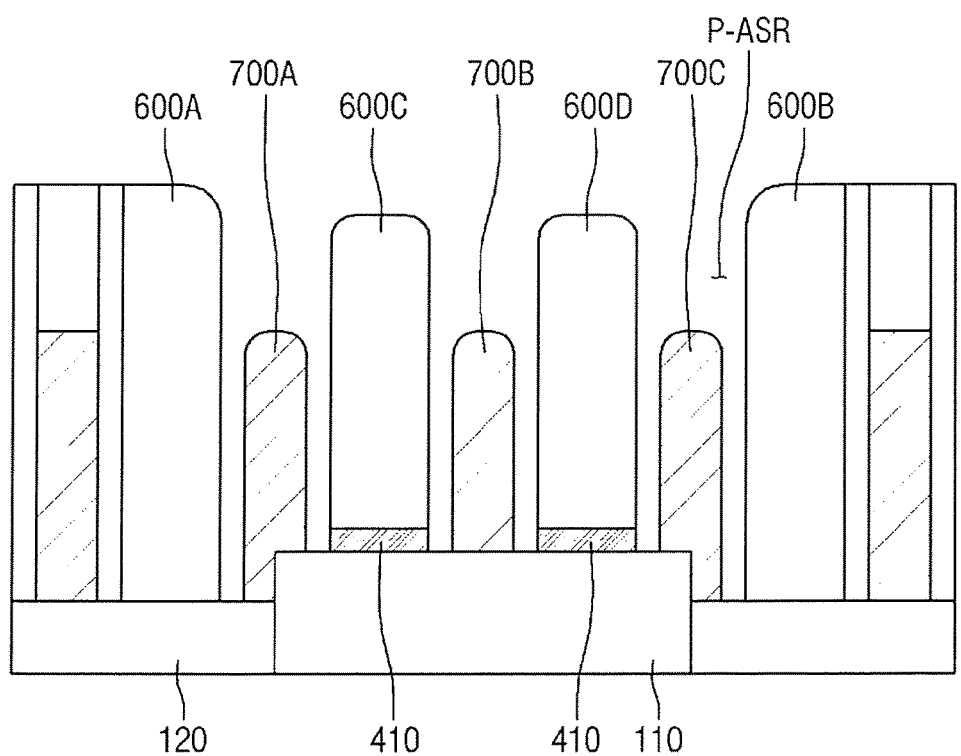

FIGS. 6A and 6B show a preliminary air spacer region P-ASR formed after step 400 of FIG. 1 is performed. The preliminary air spacer region P-ASR is formed by removing the preliminary gate spacers 230 and the gate electrode caps 710 exposed by the opening M1-O.

In step 400, an anisotropic etching process including a reactive ion etching (RIE) process is performed on the resulting structure of FIGS. 5A and 5B. The first mask M1 serves as an etch mask for the RIE process.

In an exemplary embodiment, the preliminary gate spacers 230 may be formed of SiN or SiBCN and the gate electrode caps 710A, 710B and 710C may be formed of SiN or SiBCN. In this case, the RIE process has etch selectivity of the preliminary gate spacers 230 and the gate electrode caps 710A, 710B and 710C with respect to the preliminary ILD patterns 600A, 600B and 600C and the metal gate electrodes 700A, 700B and 700C. Since the RIE process may include high energetic gases, the corners of the preliminary ILD patterns 600A, 600B and 600C be physically removed due to bombardments of the high energetic gases of the RIE process. Accordingly, the metal gate electrodes 700A, 700B and 700C have round corners after the RIE process is performed.

In an exemplary embodiment, the preliminary air spacer region P-ASR exposes the epitaxial layers 410, sidewalls of the metal gate electrodes 700A, 700B and 700C, and sidewalls of the preliminary ILD patterns 600C and 600D. The preliminary air spacer region P-ASR also exposes sidewalls of the preliminary ILD patterns 600A and 600B facing toward the preliminary air spacer region P-ASR. The preliminary air spacer region P-ASR also exposes the substrate 100.

The preliminary air spacer region P-ASR exposes an upper surface of the insulation region disposed between the metal gate electrode 700A and the preliminary ILD pattern 600A and between the metal gate electrode 700C and the preliminary ILD pattern 600B. The preliminary air spacer region P-ASR also exposes an upper surface of the active fin structure disposed between the metal gate electrode 700A and preliminary ILD pattern 600C, for example.

FIGS. 7A-9A to 7B-9B show formation of a sacrificial spacer 260 formed on the resulting structure of FIGS. 6A and 6B after step 500 of FIG. 1 is performed according to an exemplary embodiment of the present inventive concept.

Figure 7A:
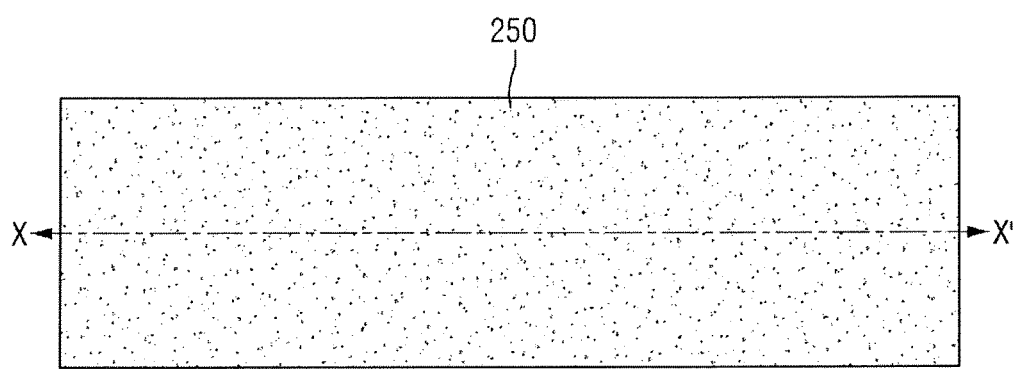
Figure 7A:
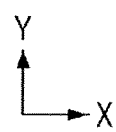
Figure 7B:
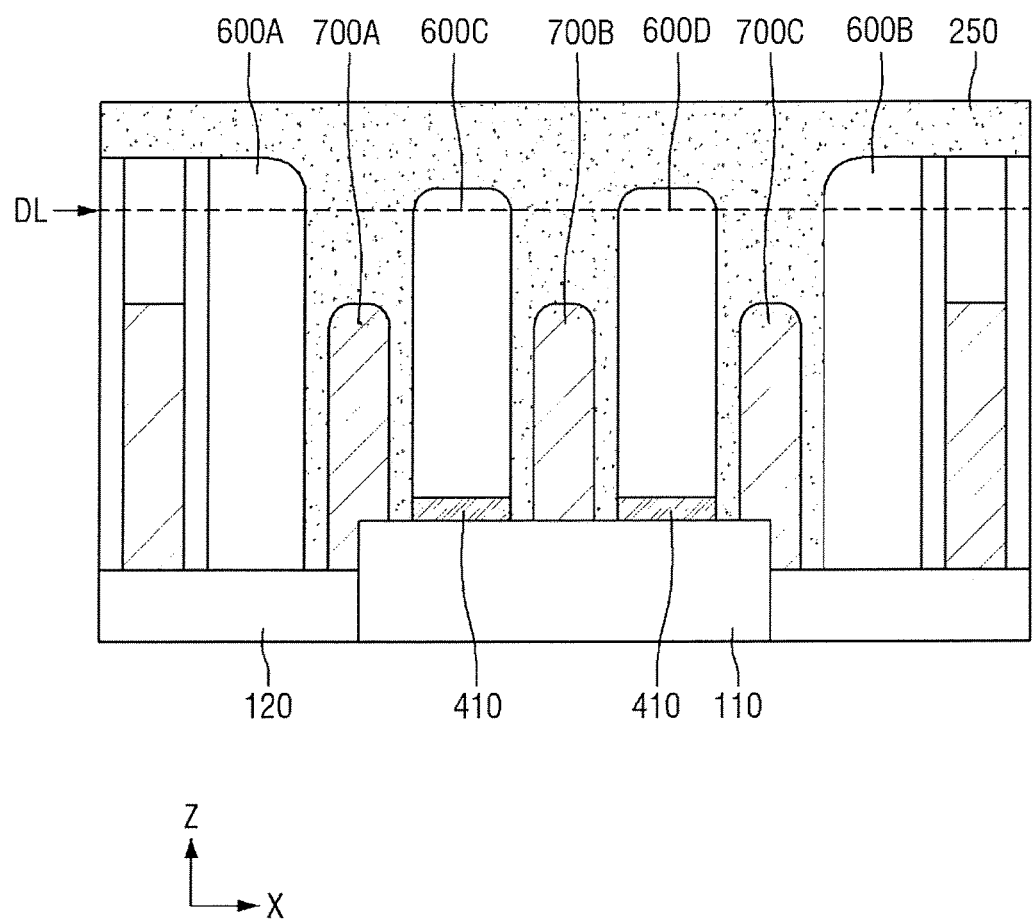

FIGS. 7A and 7B shows a sacrificial spacer layer 250 that completely fills the preliminary air spacer region P-ASR of FIGS. 6A and 6B. In an exemplary embodiment, the sacrificial spacer layer 250 covers the resulting structure of FIGS. 6A and 6B. After the formation of the sacrificial spacer layer 250, a planarization process including an etchback process or an CMP process is performed on the sacrificial spacer layer 250 to a predetermined depth as indicated a dashed line DL of FIG. 7B. In this case, the preliminary ILD patterns 600A to 600D become ILD patterns 600N to 600D' of FIG. 8B; the sacrificial spacer layer 250 becomes sacrificial spacer patterns 250A, 250B and 250C of FIG. 8B. The sacrificial spacer patterns 250A, 250B and 250B are separated from each other by the ILD patterns 600C' and 600D'. In the planarization process, the rounded corners of the preliminary ILD patterns 600A to 600D of FIG. 7B are removed so that upper surfaces of the ILD patterns 600A' to 600D' are coplanar with upper surfaces of the sacrificial spacer patterns 250A, 250B and 250C.

Figure 8A:
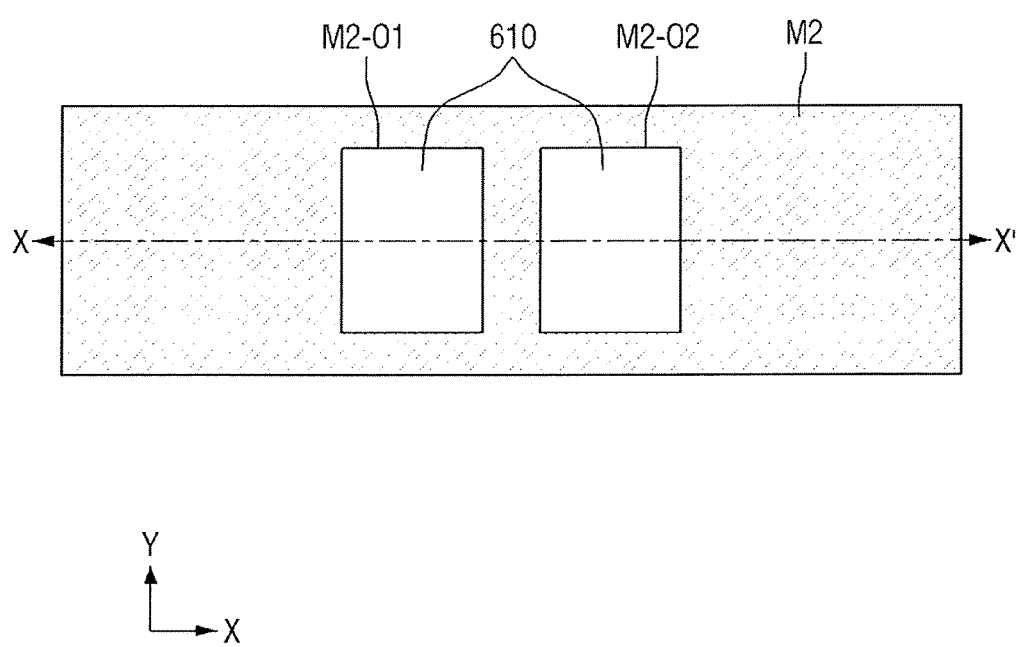
Figure 8B:
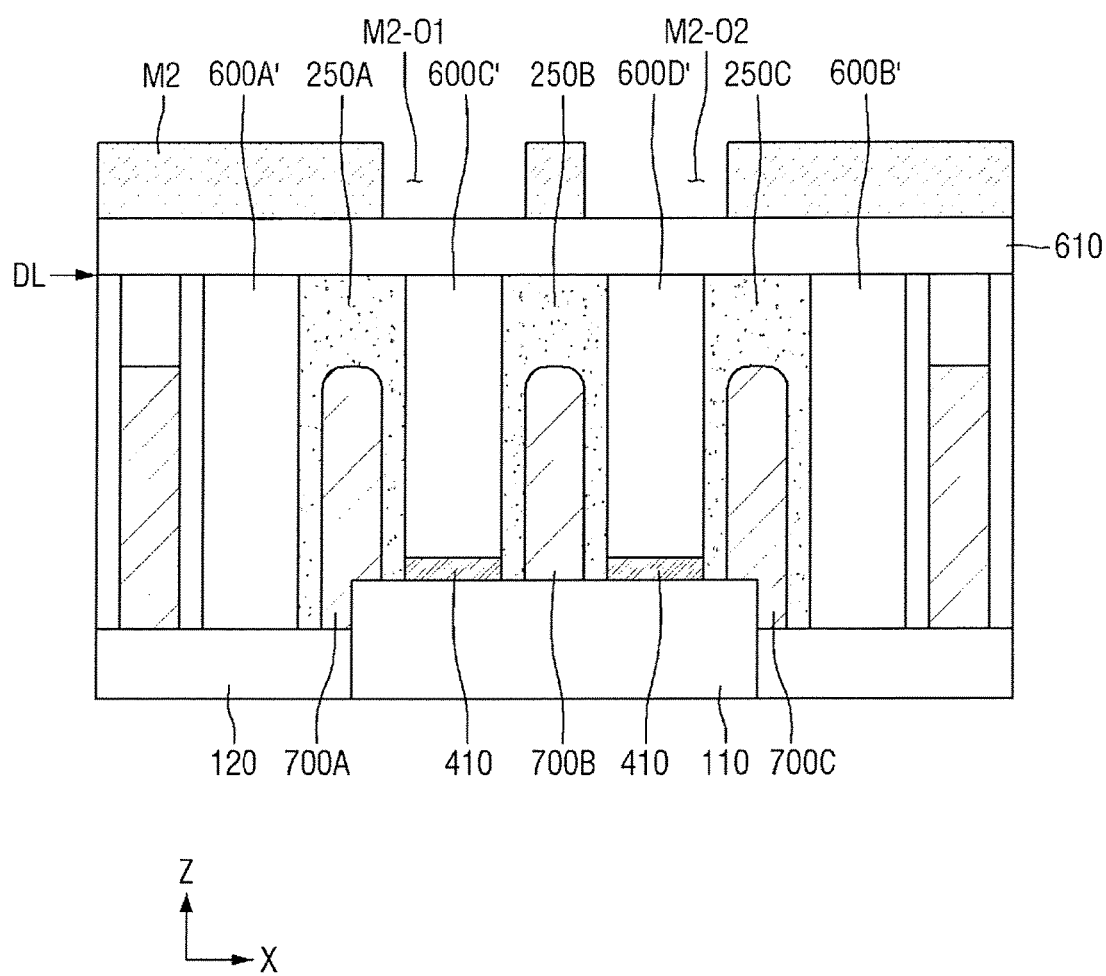

FIGS. 8A and 8B show a second mask M2 formed in step 500 of FIG. 1. In an exemplary embodiment, the second mask M2 includes mask openings M2-O1 and M2-O2 to form the sacrificial spacers 260 of FIG. 9B. Before the formation of the second mask M2, an oxide layer 610 is formed on the upper surfaces of the ILD patterns 600A' to 600D and the upper surfaces of the sacrificial spacer patterns 250A to 250C. In an exemplary embodiment, the oxide layer 610 and the ILD patterns 600A' to 600D' may be formed of a same material.

Figure 9A:
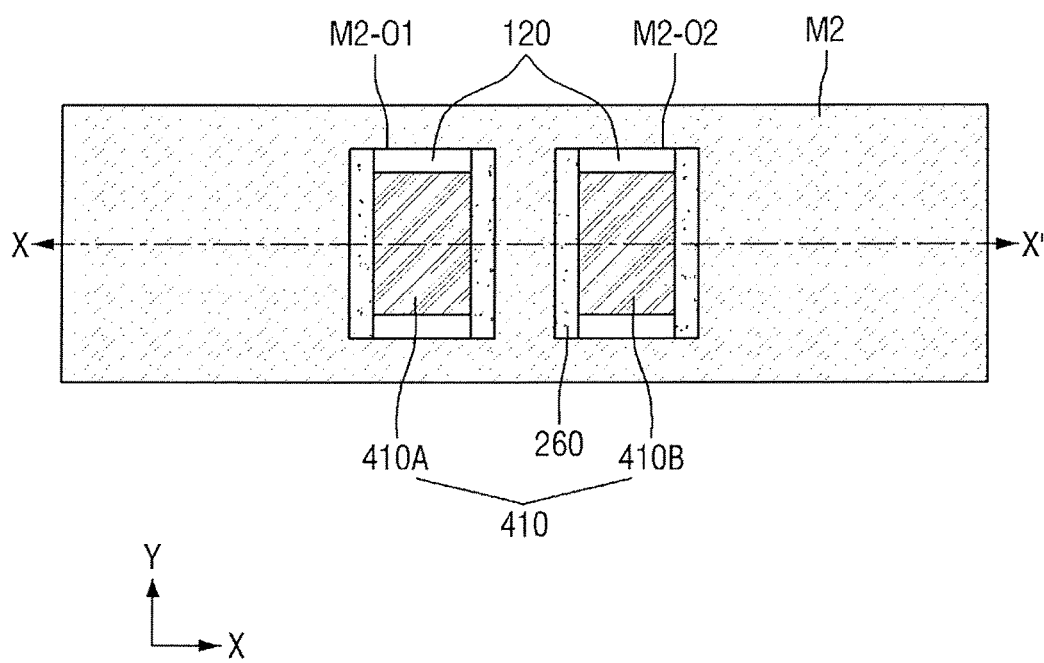
Figure 9B:
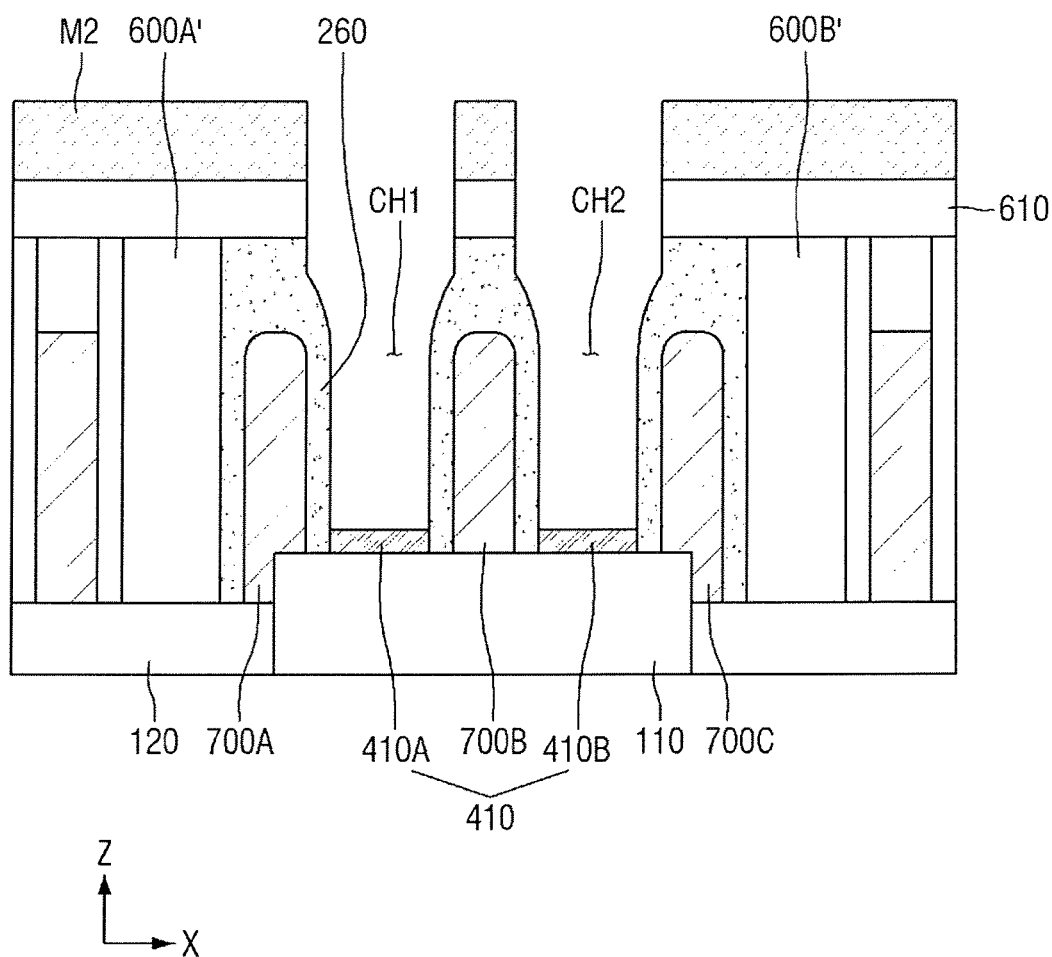

FIGS. 9A and 9B show the sacrificial spacers 260 formed after step 500 is performed. In step 500, an anisotropic etching process including an RIE process is performed on the resulting structure of FIGS. 8A and 8B. The second mask M2 serves as an etch mask for the RIE process.

In an exemplary embodiment, an etch stopper layer (not shown here) may be formed between the epitaxial layers 410 and the ILD patterns 600A' to 600D' to protect the epitaxial layer 410.

In this case, the widths of the openings M2-O1 and M2-O2 are greater than the widths of the epitaxial layers 410A and 410B. The openings M2-O1 and M2-O2 exposes the sacrificial spacers 260 formed on the sidewalls of the metal gate electrodes 700A, 700B and 700C. In an exemplary embodiment, the widths of the openings M2-O1 and M2-O2 and the widths of the epitaxial layers 410A and 410B are measured along a first direction along which the active fin structure is extended.

The lengths of the openings M2-O1 and M2-O2 are also greater than the lengths of the epitaxial layers 410A and 410B. The openings M2-O1 and M2-O2 exposes the isolation region 120 shown in FIG. 9A, which is not covered by the epitaxial layers 410A and 410B. As described with reference to FIGS. 2A and 2B, the isolation region surrounds the active fin structure 110.

The RIE process is performed on the sacrificial spacer patterns 250A to 250C of FIG. 8B to form the sacrificial spacers 260. The etch stopper layer (not shown) may protect the epitaxial layers 410A and 410B in the RIE process. After the RIE process is performed and the etch stopper layer is removed, the epitaxial layers 410A and 410B are exposed through contact holes CH1 and CH2. The contact holes CH1 and CH1 are defined by the sacrificial spacers 260. In an exemplary embodiment, the RIE process may be performed until the epitaxial layers 410A and 410B are exposed.

Figure 10A:
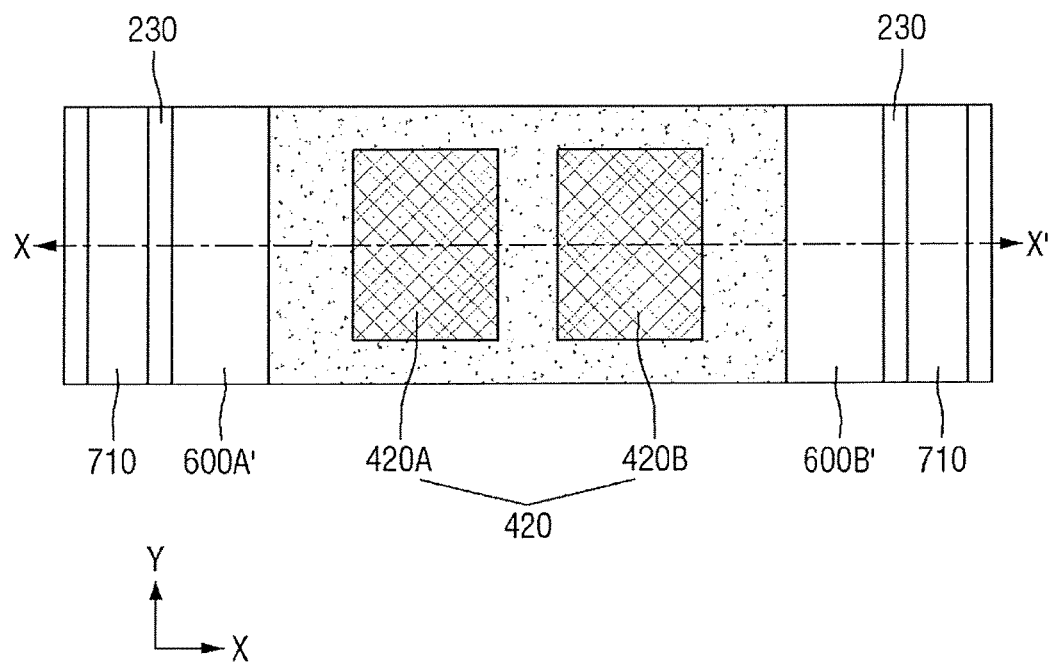
Figure 10B:
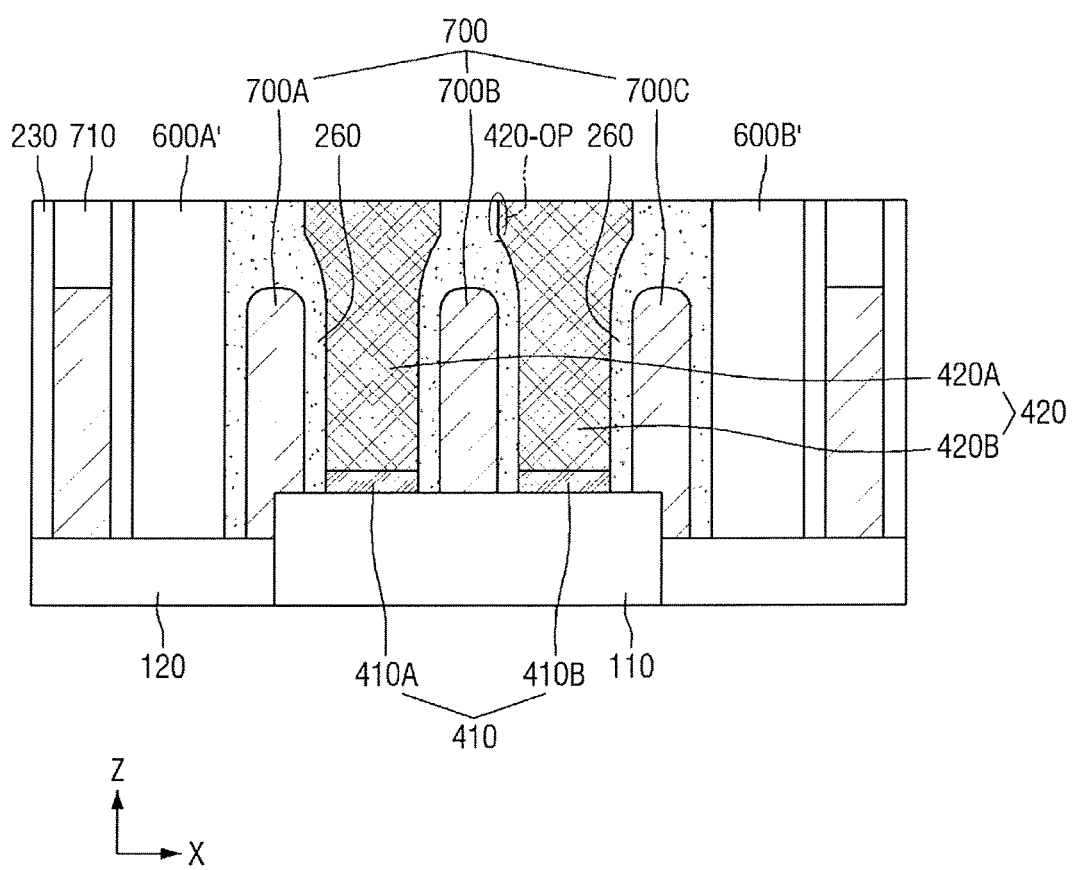

FIGS. 10A and 10B show source/drain electrodes 420 formed in the contact holes CH1 and CH2 after step 600 of FIG. 1 is performed according to an exemplary embodiment of the present inventive concept. In an exemplary embodiment, a metal layer (not shown here) may be formed on the resulting structure of the FIGS. 9A and 9B. The metal layer fills completely the contact holes CH1 and CH2. A planarizing process including an etchback process or a CMP process may be performed to form the source/drain electrodes 420. The planarized metal layer filled in the contact holes CH1 and CH2 become the source/drain electrodes 420. The source/drain electrodes 420 may be formed of metal including Al, W, or Cu. In an exemplary embodiment, the source/drain electrodes 420 may be formed of two or more metal layers stacked on each other. The source/drain electrodes 420 may further include Ti, Mo or Ta, for example.

Each of the source/drain electrodes 420 includes a lower portion and an upper portion. For example, the lower portions are in contact with the epitaxial layers 410A and 410B, and the upper portions include overhang parts 420-OP formed on the sacrificial spacers 260. The upper portions of the source/drain electrodes 420 include the overhang parts 420-OP. In an exemplary embodiment, a silicidation process may be performed after the source/drain electrodes 420 are formed. For example, the source/drain electrodes 420 may react with the epitaxial layers 410 to form silicide layers 410A' and 410B' of FIG. 11B at the boundaries between the source/drain electrodes 420 and the active fin structure 110. The silicide layers 410A' and 410B' of FIG. 11B may reduce contact resistance between the source/drain electrode 420 and the active fin structure 110. The silicide layers 410A' and 410B' of FIG. 11B may be referred to as source/drain contacts interposed between the active fin structure 110 and the source/drain electrodes 420.

In an exemplary embodiment, the silicidation process may be performed later. In this case, the elements 410N and 410B' of FIG. 11B may be the same with the epitaxial layers 410A and 410B of FIG. 10B. For the convenience of description, the silicidation process is performed before an air spacer 250 of FIG. 12B is formed.

In an exemplary embodiment, the epitaxial layer 410 may be completely consumed to form the silicide layer. In an exemplary embodiment, the epitaxial layer 410 may be partially consumed to form the silicide layer. In this case, part of the epitaxial layer 410 may remain after the silicidation process is completed.

In an exemplary embodiment, before the formation of the metal layer on the resulting structure of FIG. 9B, the second mask M2 may be removed.

Figure 11A:
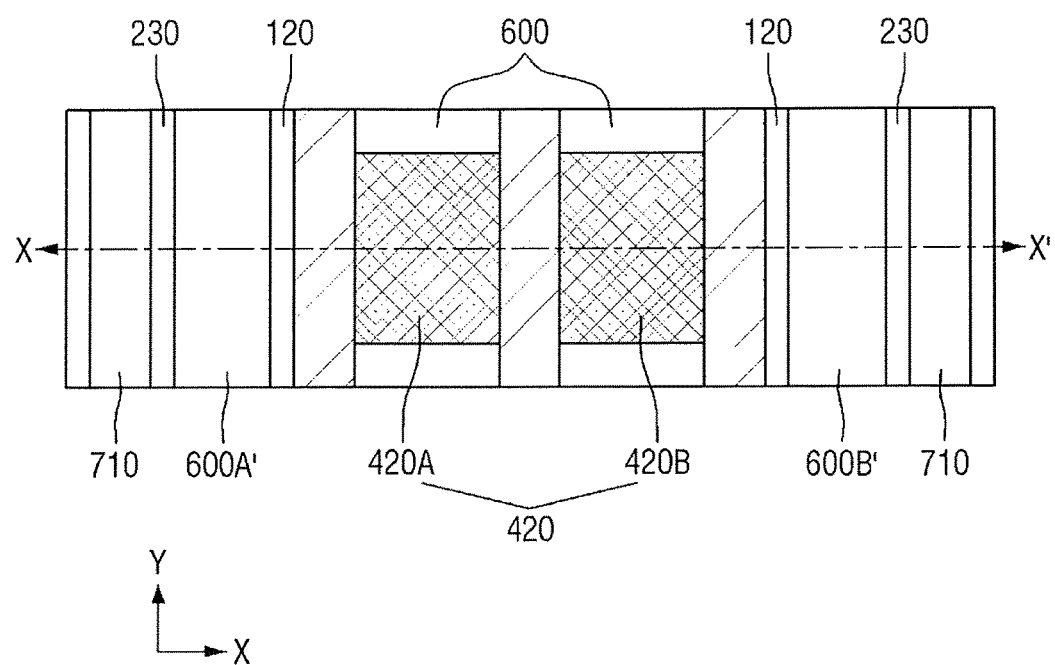
Figure 11B:
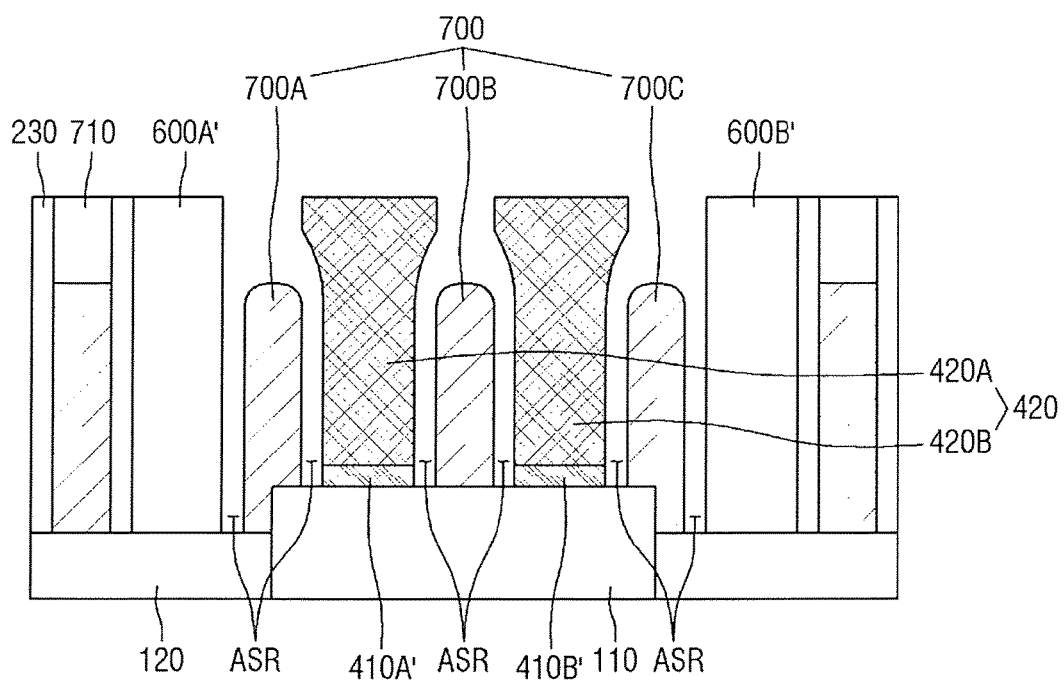

FIGS. 11A and 11B show an air spacer region ASR after step 700 of FIG. 1 is performed according to an exemplary embodiment of the present inventive concept. The air spacer region ASR exposes sidewalls of the source/drain electrodes 420A and 420B. The air spacer region ASR exposes the active fin structure 110 and the insulation region 120.

Figure 12A:
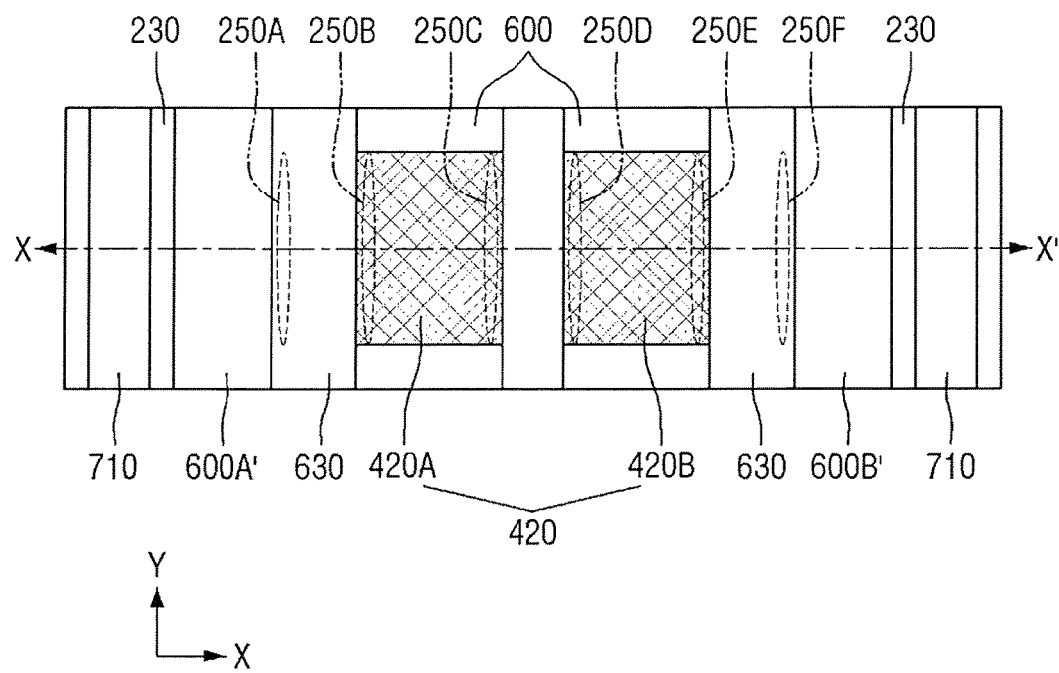
Figure 12B:
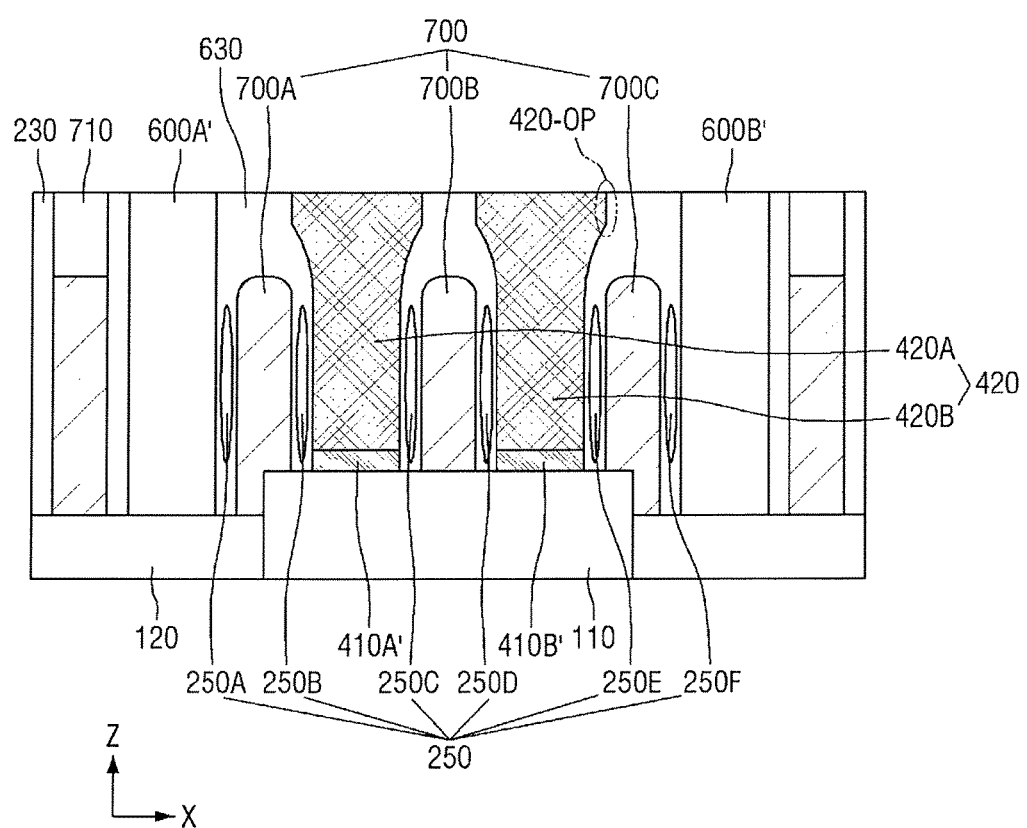

In an exemplary embodiment, the air spacer region ASR is formed by removing the sacrificial spacers 260 using an isotropic etching process including a wet etching or a dry etching process. The isotropic etching process may include etchant or etchant gases having etch selectivity for the sacrificial spacers 260 with respect to the ILD patterns 600', the metal gate electrodes 700 and the source/drain electrodes 420. The isotropic etching process may also selectively the sacrificial spacers 260 from the isolation region 120 and the active fin structure 110. The isotropic etching process may also selectively the sacrificial spacers 260 from the epitaxial layers FIGS. 12A and 12B show an air spacer formed after step 800 of FIG. 1 is performed according to an exemplary embodiment of the present inventive concept. Low-k ILD patterns 630 are formed in the air spacer region ASR of FIGS. 11A and 11B using a deposition process.

The deposition process for deposing the low-k ILD patterns 630 may be controlled so that voids are formed inside of the low-k ILD patterns 630. When viewed from the above as shown in FIG. 12A, the low-k ILD patterns 630 completely fill the air spacer region ASR. However, the low-k ILD patterns 630 have voids therein, and the voids correspond to air spacers 250. The air spacer 250 includes air spacers 250A to 250F that are separated from each other. The air spacers 250A to 250F are arranged in parallel to the first direction (x-axis), and the air spacers 250A to 250F are in parallel to each other along the second direction. The air spacers 250A to 250F are extended along the second direction. The air spacers 250B to 250E are interposed between the source/drain electrodes 420 and the metal gate electrodes 700. The air spacers 250A and 250B are interposed between the first ILD pattern 600' and the metal gate electrode 700.

The air spacers 250B to 250E are disposed under the overhang parts 420-OP of the source/drain electrode 420. In an exemplary embodiment, the overhang parts 420-OP is extended along the first direction only, and no overhang parts are formed along the second direction. In this case, the air spacers 250B to 250E are not connected to each other, and are spaced apart from each other.

In an exemplary embodiment, each of the source/drain electrodes 420 has an upper surface having a first width and a lower surface having a second width less than the first width. The first and second widths are measured in the first direction.

A width of each of the air spacers 250B to 250E formed on the active fin structure 110 are substantially equal to or less than a difference between the first and second widths of the source/drain electrode 420. In this case, the width of each of the air spacers 250B to 250E is also measured along the first direction.

In an exemplary embodiment, the low-k ILD patterns 630 are formed on the active fin structure 110, and the ILD patterns 600 are formed on the isolation regions 120. In an exemplary embodiment, the low-k ILD pattern 630 may be formed of a low-k ILD material of which a dielectric constant is smaller than a dielectric constant of the ILD pattern 600. For example, the low-k ILD patterns 630 are formed of an low-k ILD material including organic silica glasses (OSG), and the ILD patterns 600 are formed of silicon oxide.

In an exemplary embodiment, the gate electrode caps 710 are formed on the isolation regions 120, and the low-k ILD patterns 630 are formed on the active fin structure 110. For example, the metal gate electrodes 700 formed on the active fin structure 110 are covered by the low-k ILD patterns 630.

Figure 13:
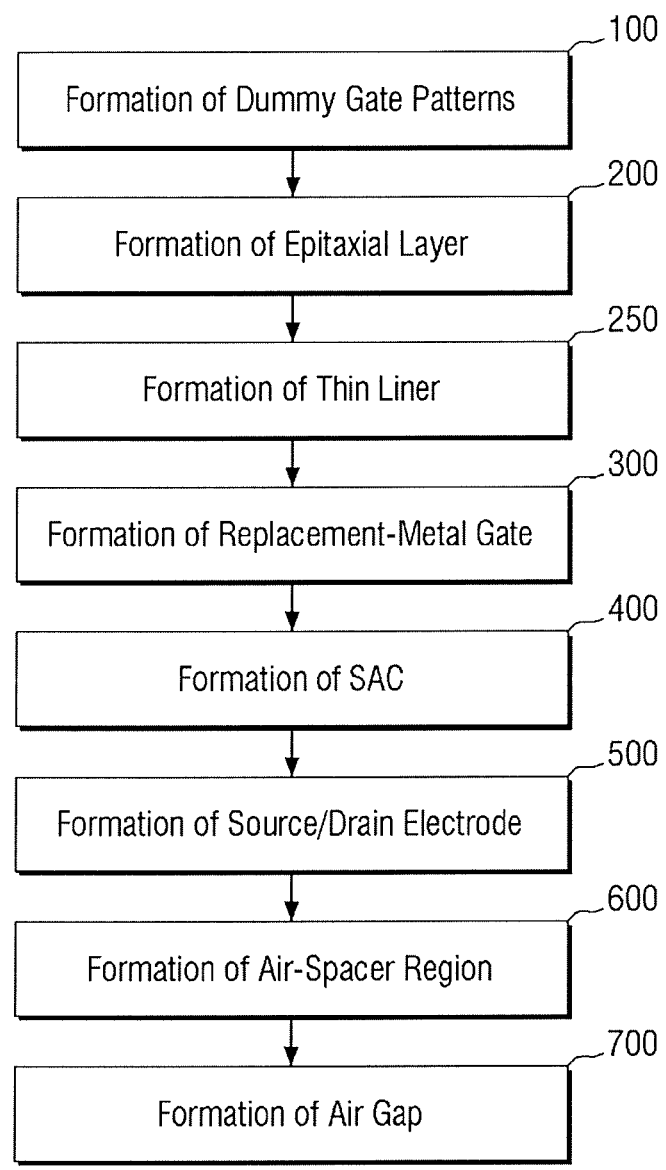
FIG. 13 is a flowchart of fabricating a semiconductor device according to an exemplary embodiment of the present inventive concept.

Hereinafter, a method of fabricating a semiconductor device will be described with reference to FIG. 13, FIGS. 14A to 23A, and FIGS. 14B to 23B. FIG. 13 is a flowchart of fabricating a semiconductor device according to an exemplary embodiment of the present inventive concept. FIGS. 14A to 23A show plan views of the semiconductor device formed according to the flowchart of FIG. 13. FIGS. 14B to 23B show cross-sectional views taken along X-X' of FIGS. 14A to 23A. For example, the semiconductor device may include a transistor having air spacer between a gate electrode and a source/drain electrode. The air spacer may serve as an electrical isolation between the gate electrode and the source/drain electrode.

Steps 100 and 200 of FIG. 13 are substantially the same with the steps 100 and 200 of FIG. 1. For the convenience of description, the remaining steps of FIG. 13 will be described with reference to the resulting structure of FIGS. 3A and 3B.

FIGS. 14A-15A and 14A-15B show a thin liner layer 240 after step 250 of FIG. 13 is performed according to an exemplary embodiment of the present inventive concept.

Figure 14A:
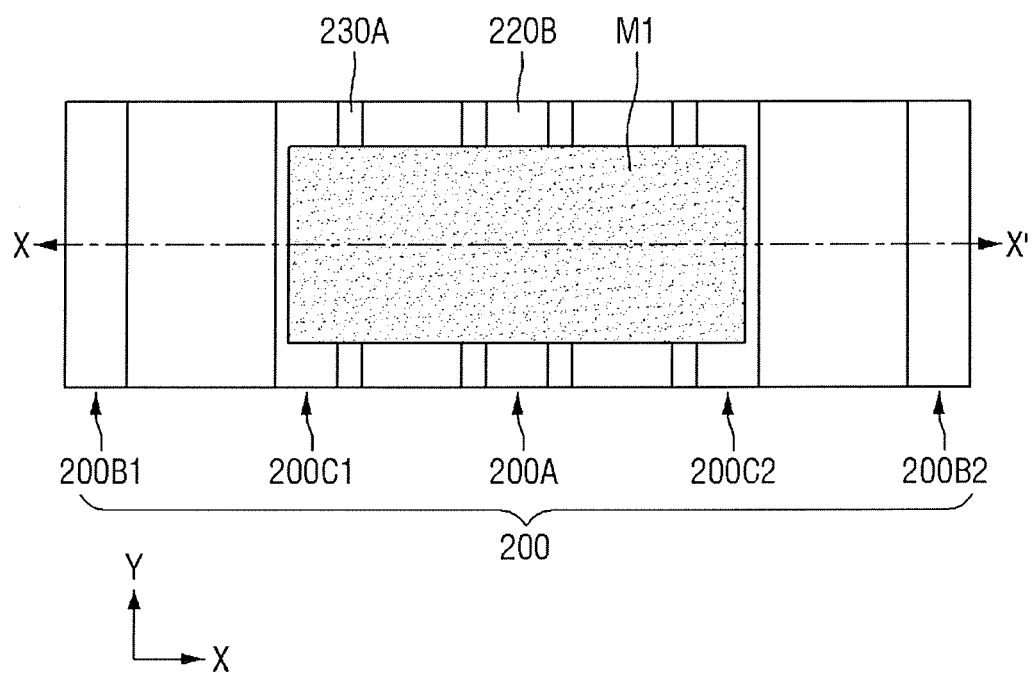
Figure 14B:
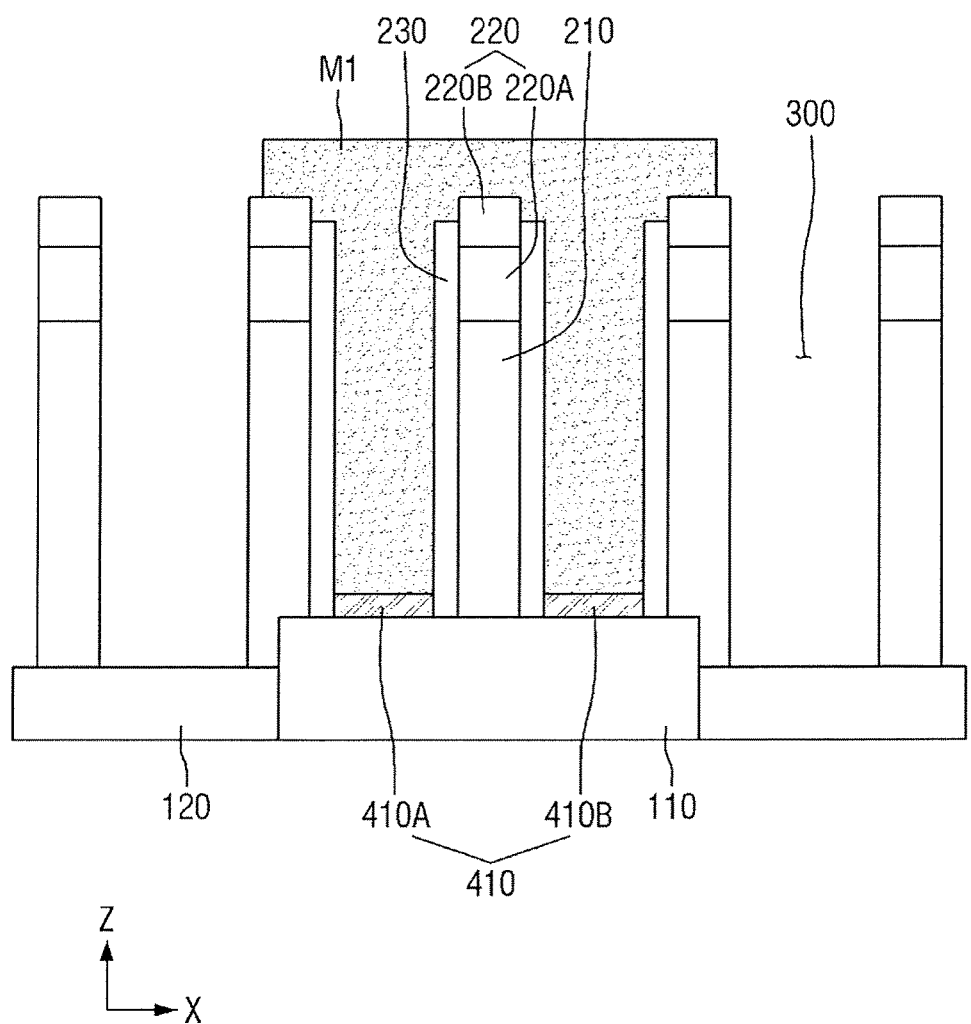

FIGS. 14A and 14B show a first mask M1 covering the epitaxial layers 410 formed on the resulting structure of FIGS. 3A and 3B. For example, the first mask M1 is formed on the active fin structure 110. In an exemplary embodiment, the preliminary gate spacers 230 disposed on the isolation region 120 are removed using an etching process, and then the first mask M1 is removed. The first mask M1 is used as an etch mask for the etching process.

Figure 15A:
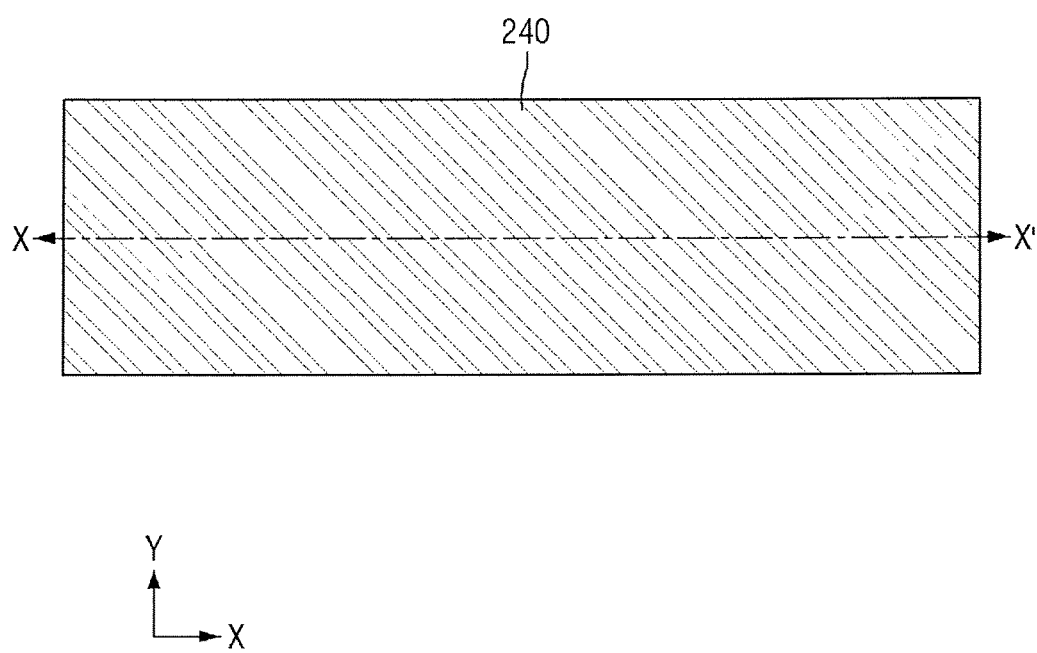
Figure 15B:
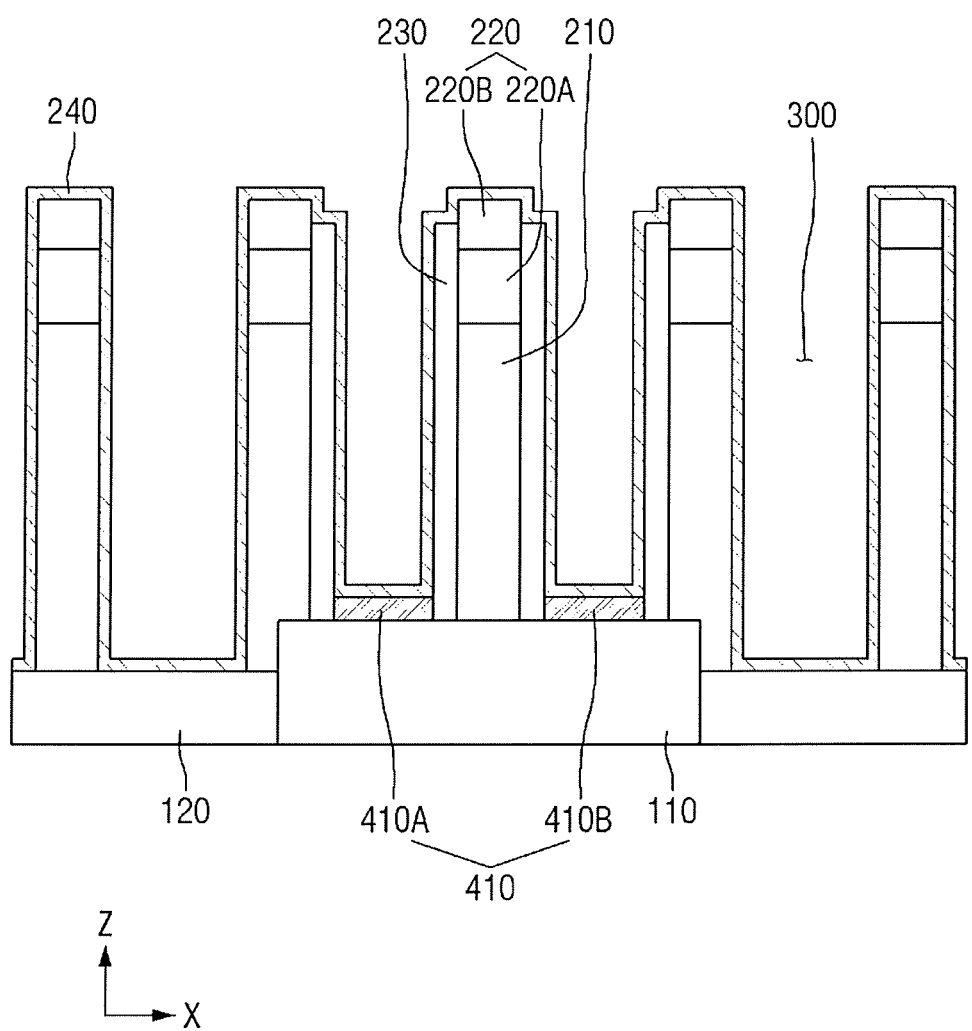

FIGS. 15A and 15B show the thin liner layer 240 formed on the active fin structure 110 and the isolation region 120. The mask M1 is removed before the thin liner layer 240 is formed. The thin liner layer 240 is conformally formed on the dummy gate patterns 210 that are disposed on the isolation region 120 and the preliminary gate spacers 230 that are disposed on the active fin structure 110.

In an exemplary embodiment, the thin liner layer 240 has a thickness smaller than a thickness of the preliminary gate spacer 230. The thicknesses of the thin liner layer 240 and the preliminary gate spacer 230 are measured in the first direction.

Figure 16A:
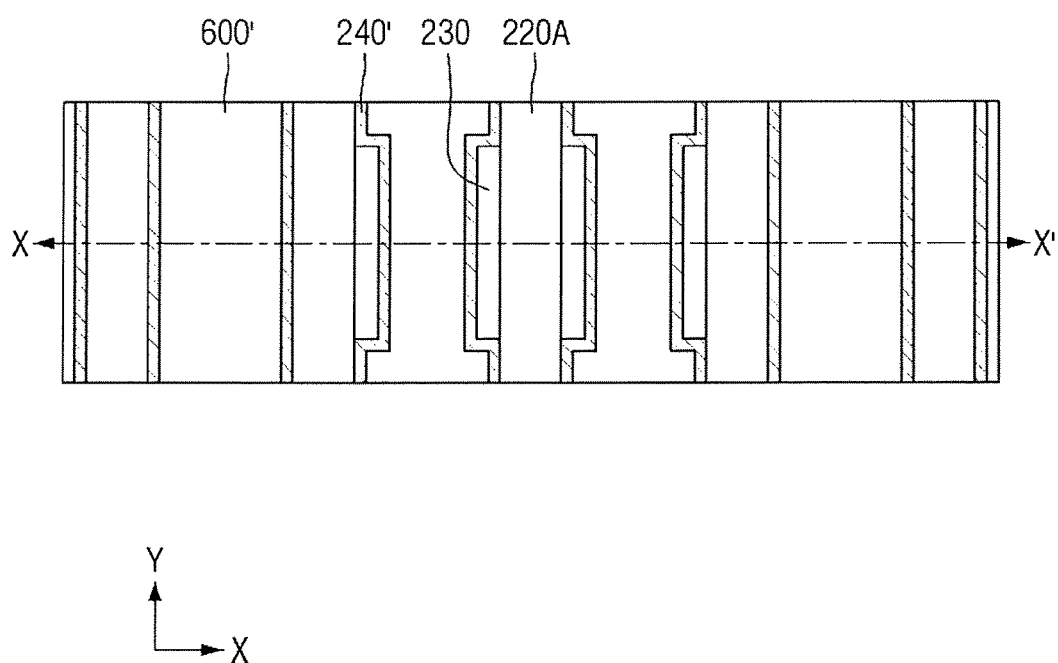
Figure 16B:
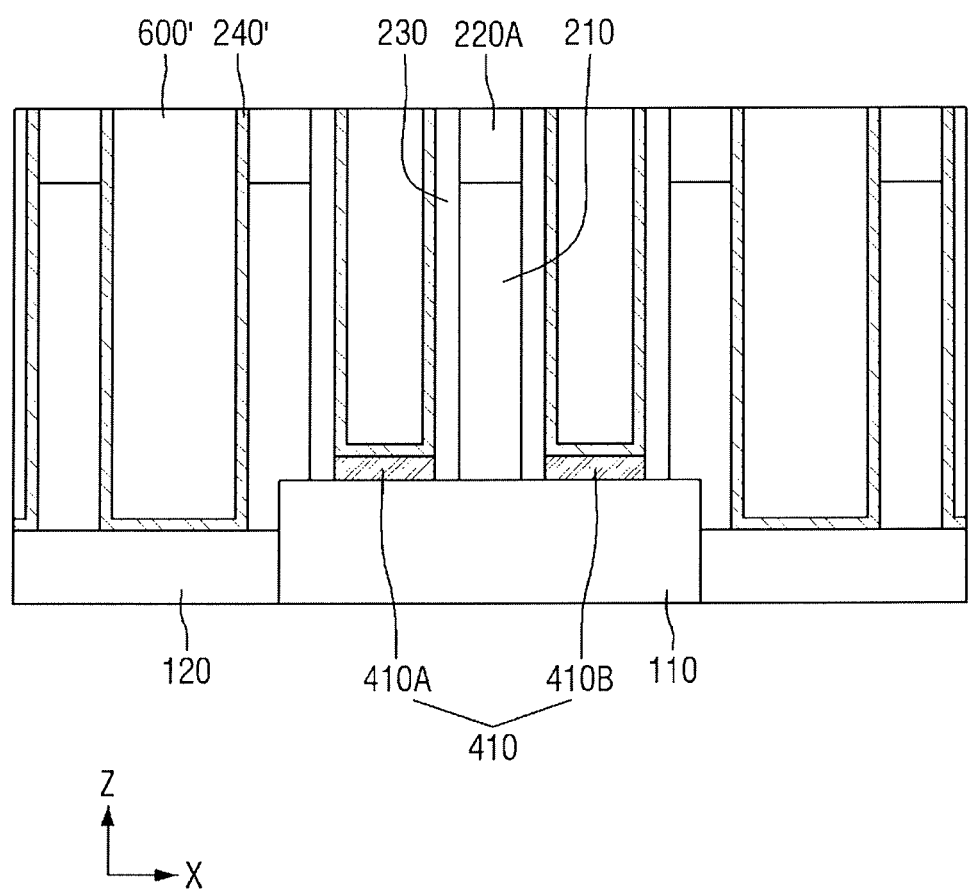

FIGS. 16A and 16B show ILD patterns 600' on the resulting structure of FIGS. 15A and 15B. ILD patterns 600' are formed on thin liner patterns 240', completely filling trenches 300 of FIG. 15B. In an exemplary embodiment, an ILD layer (not shown here) may cover the resulting structure of FIGS. 15A and 15B, and then a planarization process including an etchback process or a CMP process is performed on the ILD layer until the first mask pattern 220A is exposed. For example, the second mask pattern 220B is removed in the planarization process. The thin liner layer 240 becomes thin liner patterns 240', and the ILD layer becomes ILD patterns 600'. The preliminary gate spacer 230 has a reduced height compared with the height of the preliminary gate spacer 230 before the planarization process is performed. The preliminary gate spacer 230 has a reduced length because an exposed portion 230A of the preliminary gate spacer 230 by the first mask M1 as shown in FIG. 14 is removed in step 250 of FIG. 13. The length is measured along the second direction.

In this case, the preliminary gate spacer 230 of FIG. 16 is surrounded by the liner patterns 240' and the first mask pattern 220A in a plan view of FIG. 16A. The preliminary gate spacers 230 formed on the active fin structure 110 are interposed between the dummy gate patterns 210 and the preliminary gate spacers 230. No preliminary gate spacers remain on the isolation region 120.

Figure 17A:
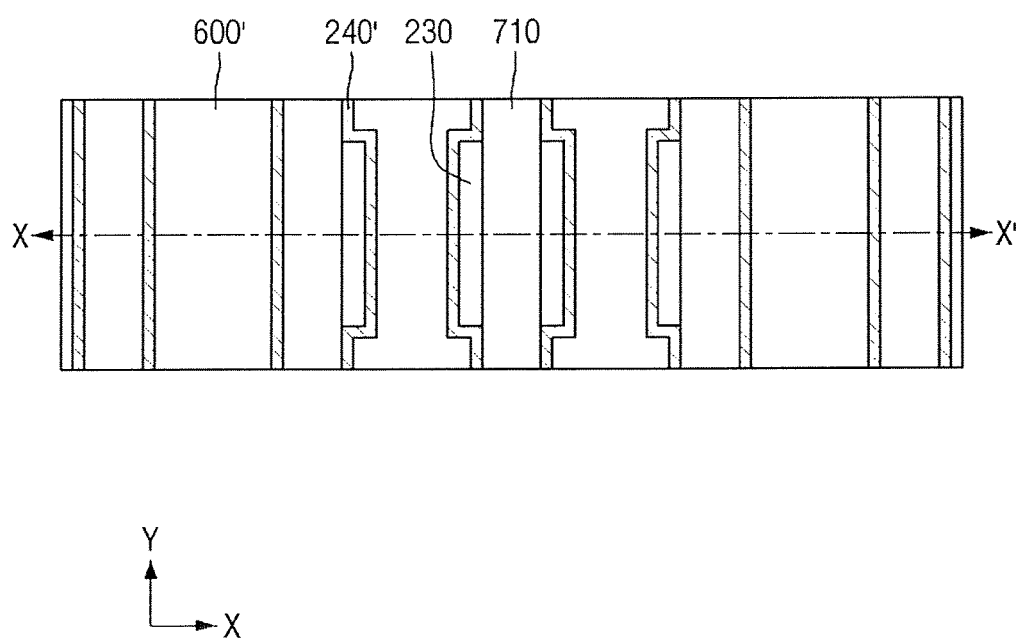
Figure 17B:
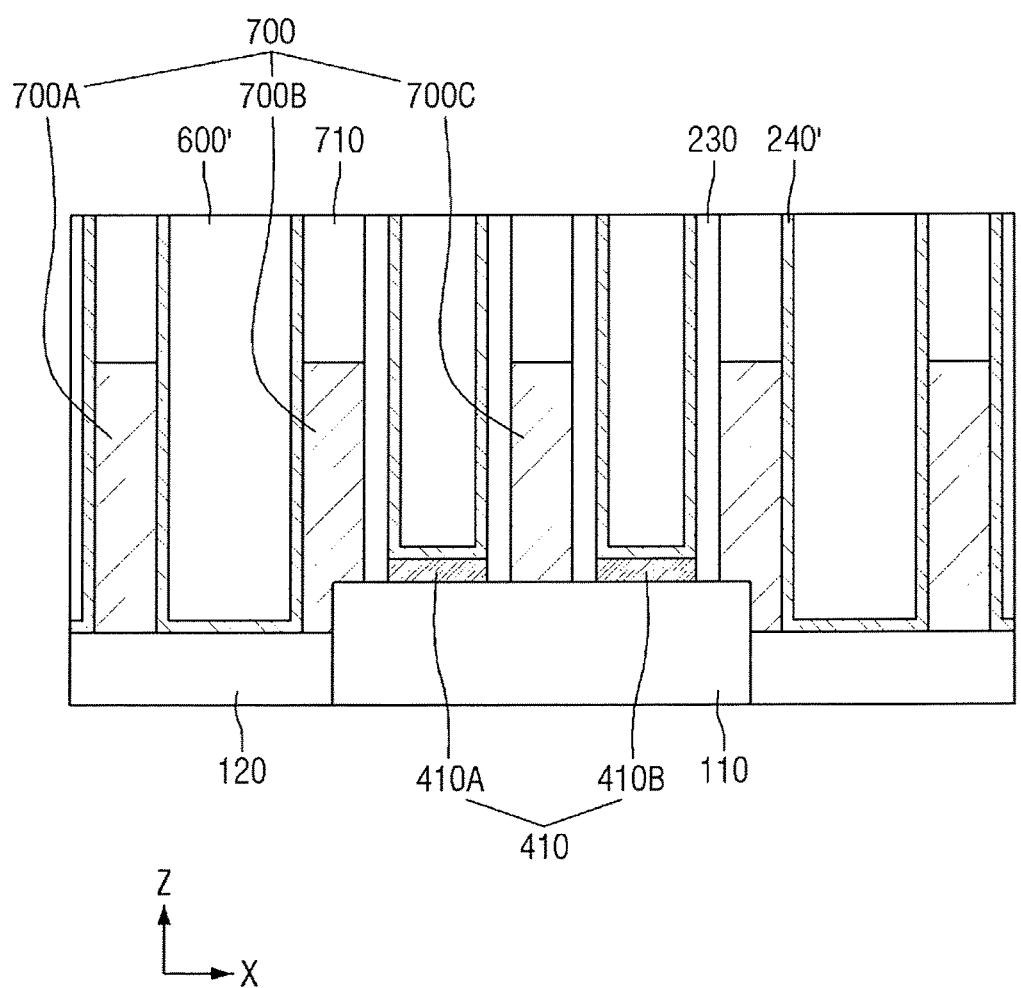

FIGS. 17A and 17B show metal gate electrodes 700 and gate electrode caps 710 formed after step 300 of FIG. 13 is performed according to an exemplary embodiment of the present inventive concept. In this case, the gate electrode cap 710 may be formed of SiBCN. An RMG process may be performed on the resulting structure of FIGS. 16A and 16B.

In an exemplary embodiment, the metal gate electrodes 700 include a first metal gate electrode 700A, a second metal gate electrode 700B and a third metal gate electrode 700C. The first metal gate electrode 700A is formed on the isolation region 120, and is interposed between two adjacent liner patterns 240'. The third metal gate electrode 700C is formed on the active fin structure 110, and is interposed between two adjacent preliminary gate spacers 230. The second metal gate electrode 700B is formed on a boundary between the active fin structure 110 and the isolation region 120. For example, the second metal gate electrode 700B is formed on both the active fin structure 110 and the isolation region 120. In this case, the second metal gate electrode is interposed between the preliminary gate spacer 230 and the liner pattern 240' adjacent to the boundary.

FIGS. 18A-19A and 18B-19B show self-aligned contact holes SACH1 and SACH2 formed after step 400 is performed according to an exemplary embodiment of the present inventive concept.

Figure 18A:
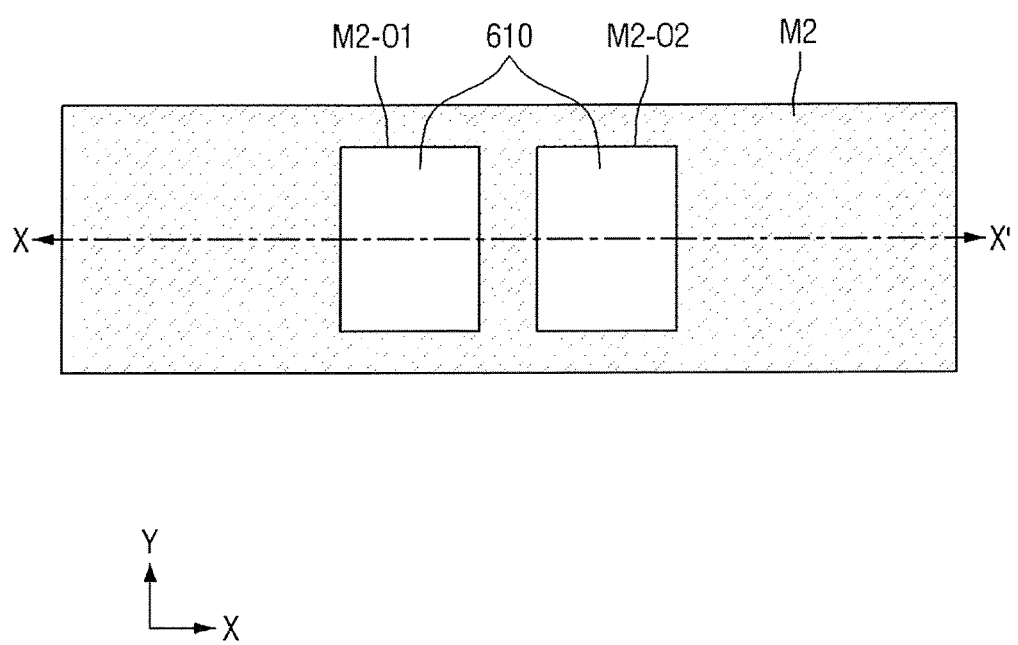
Figure 18B:
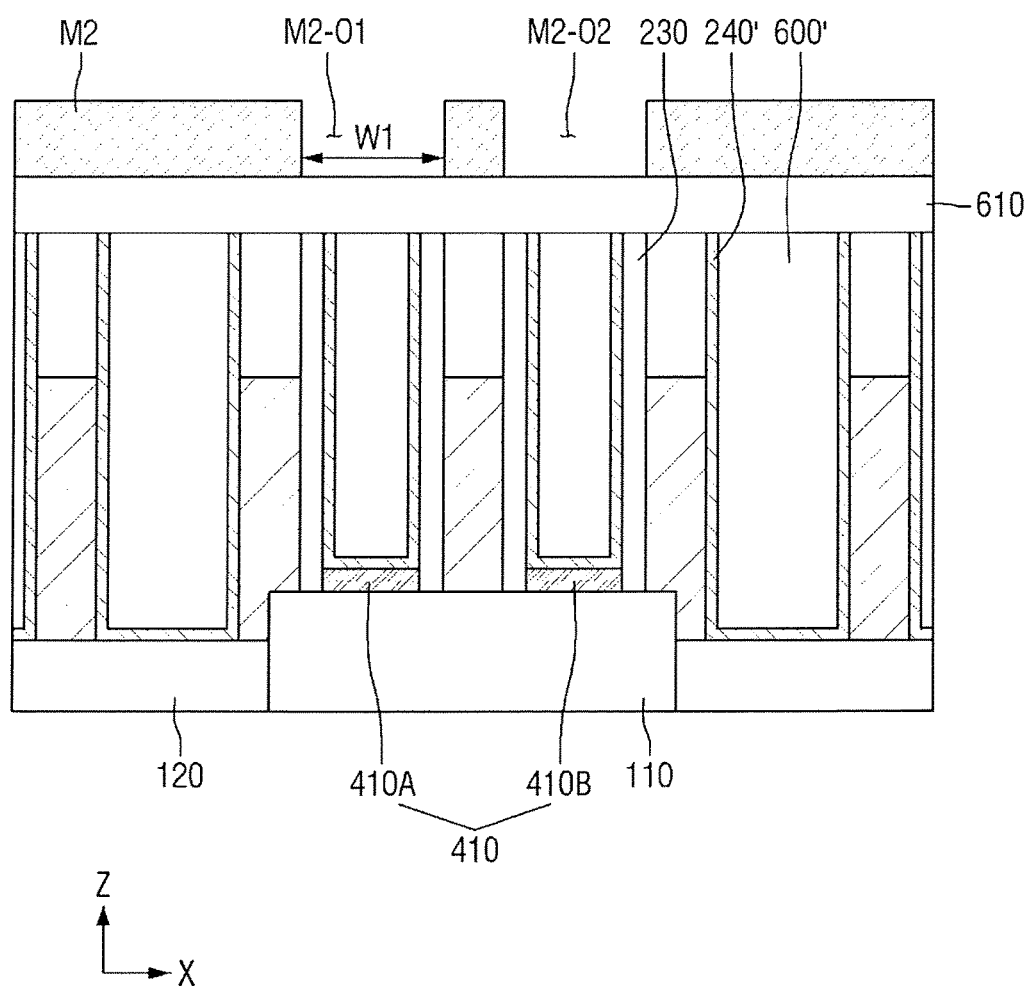

FIGS. 18A and 18B show a second mask M2 to define a self-aligned contact holes SACH1 and SACH2. In an exemplary embodiment, the second mask M2 includes an opening M2-O having a first width W1 which is greater than a width of the epitaxial layer 410. The first width of the second mask M2 and the width of the epitaxial layer 410 are measured along the first direction.

Before the forming of the second mask M2, an oxide layer 610 is formed on the resulting structure of FIGS. 17A and 17B. In an exemplary embodiment, the oxide layer 610 and the ILD pattern 600' are formed of the same material including a silicon oxide. for example.

Figure 19A:
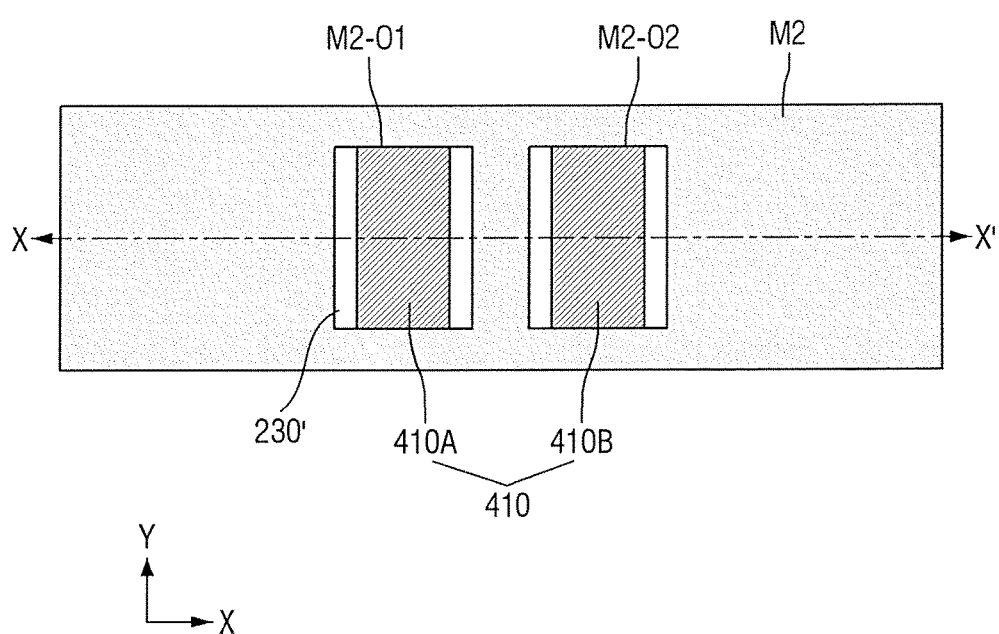
Figure 19B:
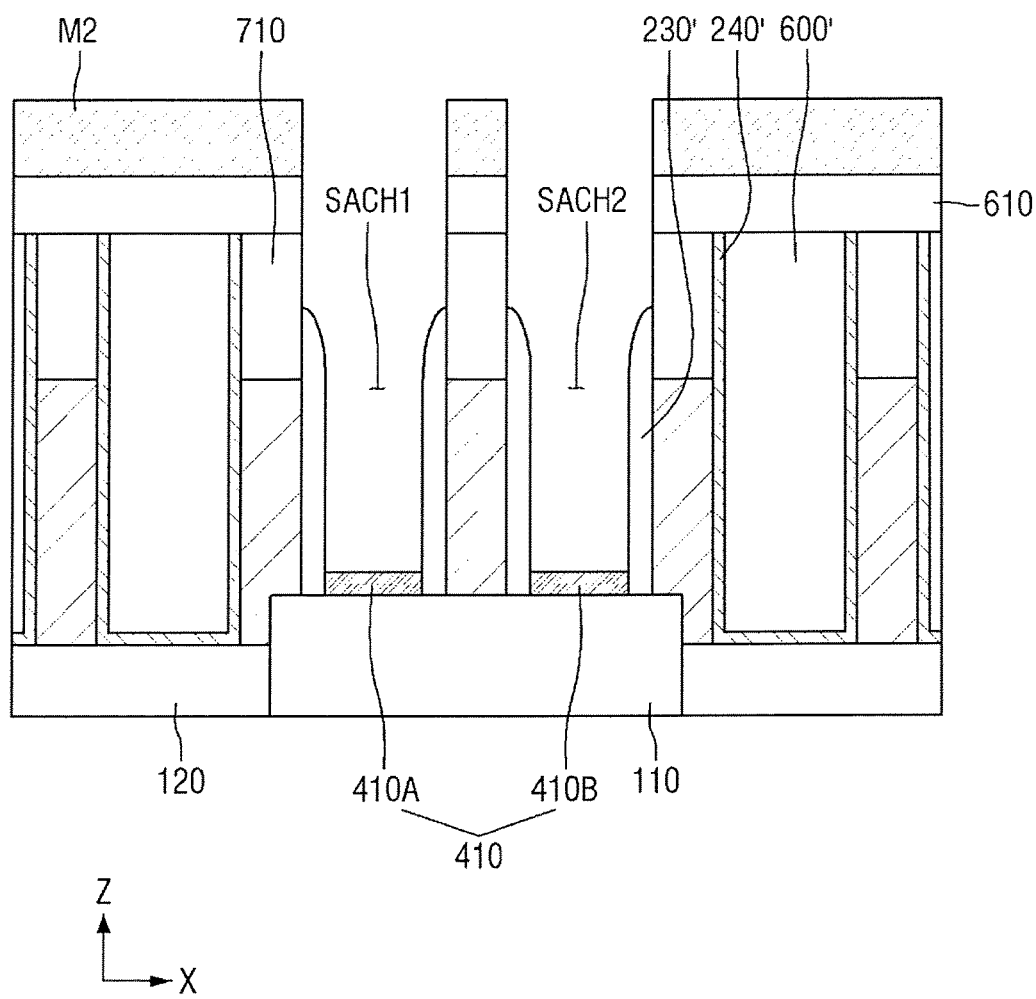

FIGS. 19A and 19B show the self-aligned contact holes SACH1 and SACH2. In an exemplary embodiment, a directional etching process including an RIE process is performed on the resulting structure of FIGS. 18A and 18B using the second mask M2 as an etch mask. The directional etching process is performed to form gate spacers 230' from the preliminary gate spacers 230 of FIG. 18B. In this case, the liner patterns 240' may serve as an etch stopper in the direction etching process. The liner patterns 240' may be partially removed in the directional (anisotropical) etching process, but parts of the liner patterns 240' formed on the epitaxial layers 410 may remain to protect the epitaxial layers 400 in the directional etching process. After the formation of the gate spacers 230', the remaining liner patterns 240' may be removed using an isotropical etching process including a wet etching or a dry etching until the epitaxial layers 410 are exposed through the self-aligned contact holes SACH1 and SACH2. In the directional etching process, the preliminary gate spacers 230 exposed through the openings M2-O1 and M2-O2 are recessed to a predetermined depth. The ILD patterns 600' may be completely removed in the directional etching process, and the remaining liner patterns 240' may protect the epitaxial layers 410 in the directional etching process.

Figure 20A:
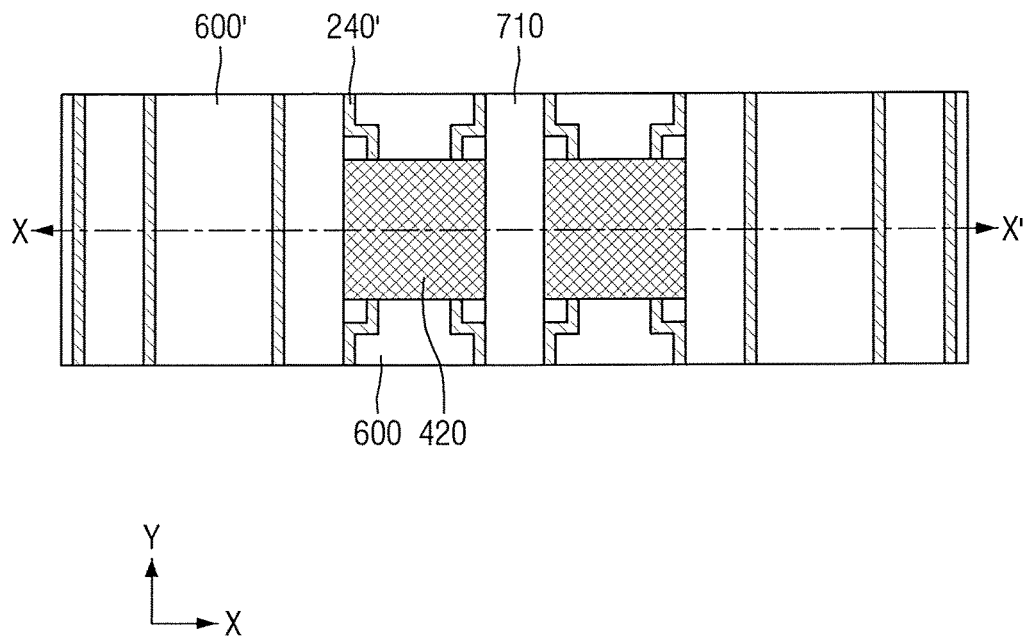
Figure 20B:
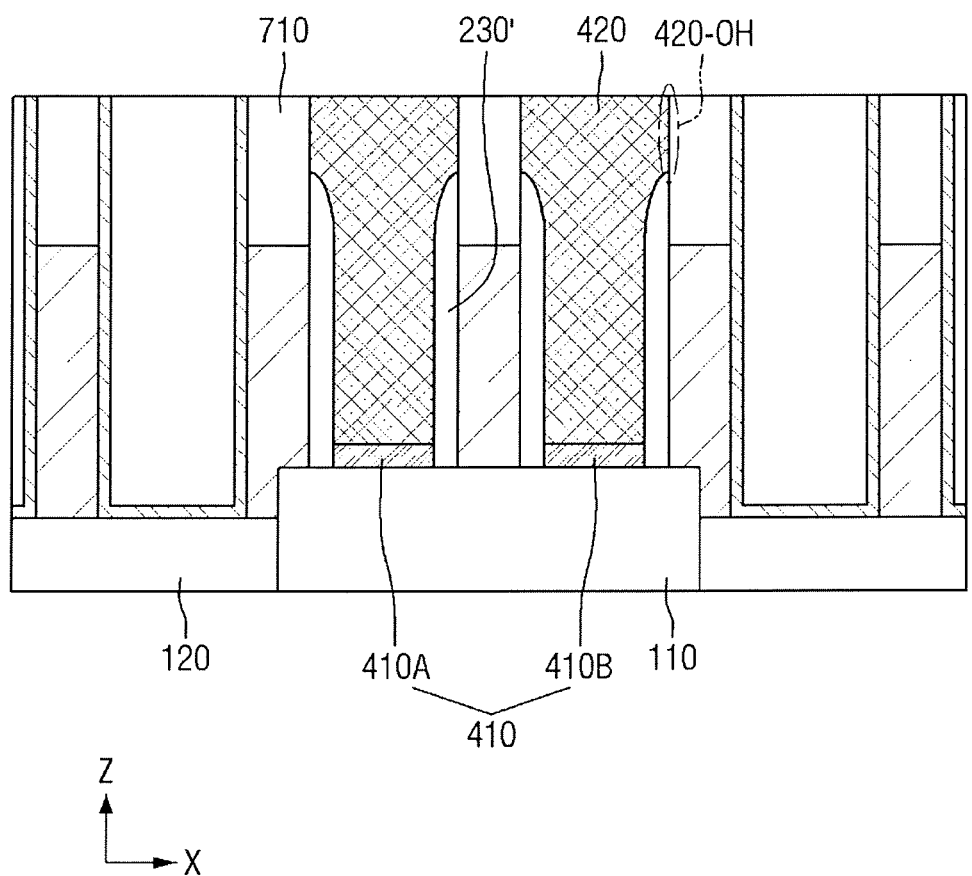

FIGS. 20A and 20B show source/drain electrodes 420 formed after step 500 of FIG. 13 is performed. The source/drain electrodes 420 fill completely the self-aligned contact holes SACH1 and SACH2 so that the source/drain electrodes 420 are in contact with the epitaxial layers 410. According to the shapes of the self-aligned contact holes SACH1 and SACH2, the source/drain electrode 420 has an upper surface having a first width and a lower surface having a second width smaller than the first width of the source/drain electrode 420. For example, the source/drain electrode 420 includes an overhang part 420-OH which is extend beyond a bottom portion of the source/drain electrode 420 by a difference between the first and second widths of the source/drain electrode 420. As discussed in the previous embodiment, a silicidation process may be performed before or after an air spacer 250 of FIG. 23B is formed.

Figure 23A:
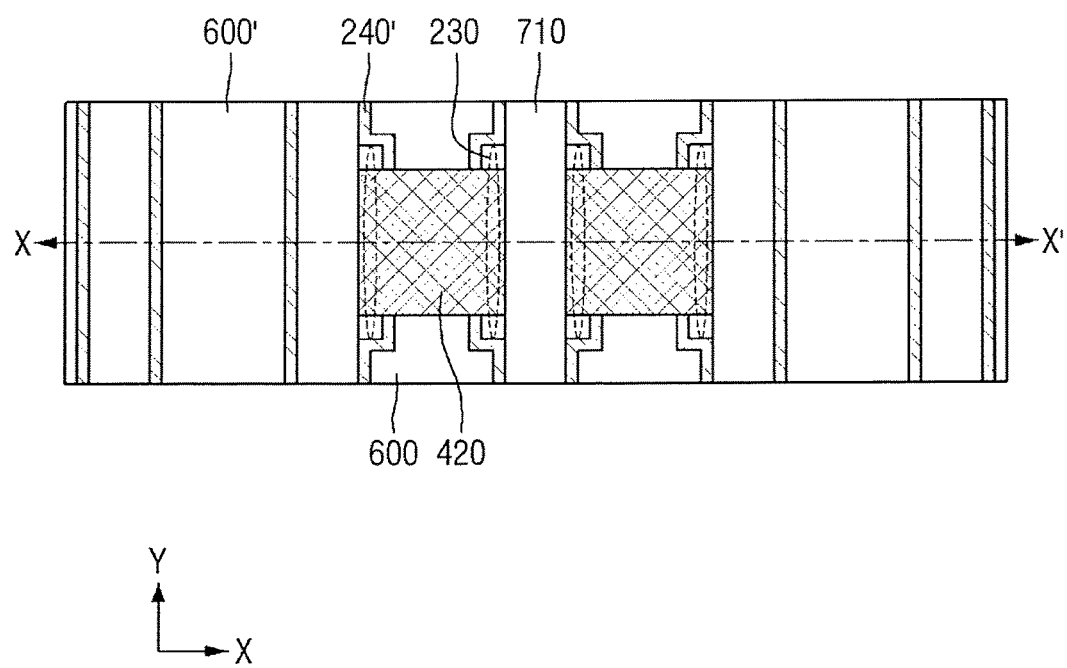
Figure 23B:
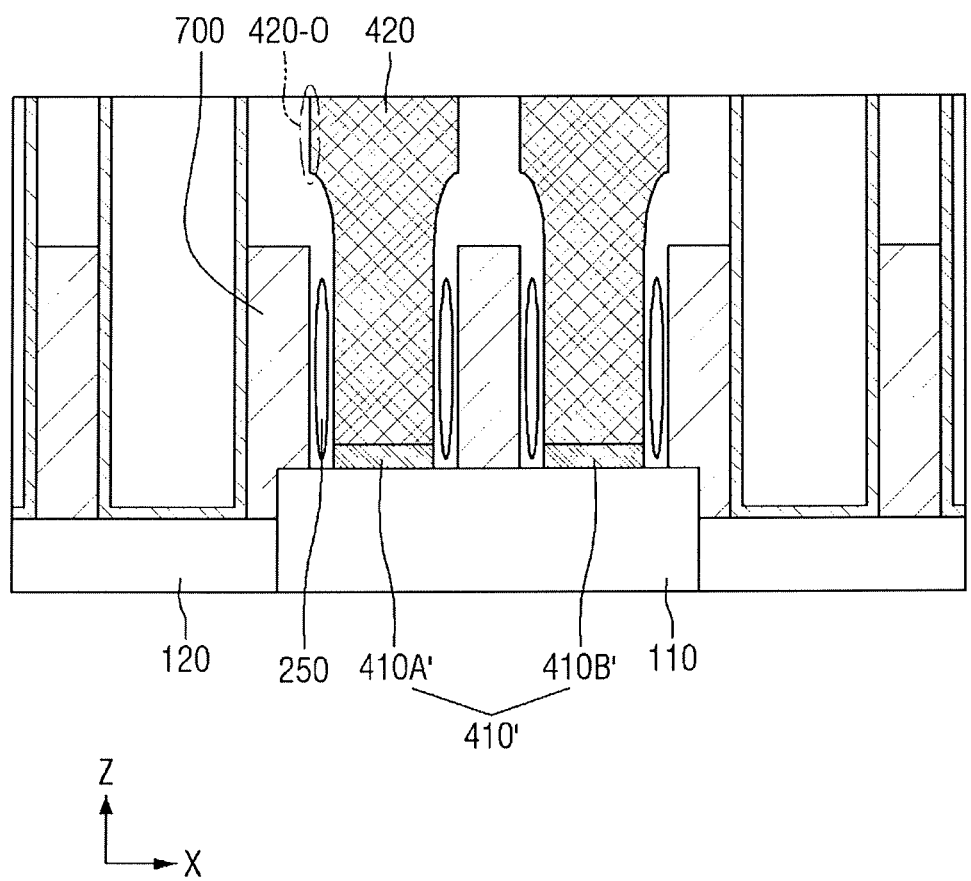

For the convenience of description, a silicidation process is performed before the formation of the air spacer 250 of FIG. 23B. In this case, the epitaxial layer 410 becomes a silicide layer 410' of FIG. 21B.

FIGS. 21A-22A and 21B-22B show an air spacer region ASR formed after step 600 of FIG. 13 is performed according to an exemplary embodiment of the present inventive concept.

Figure 21A:
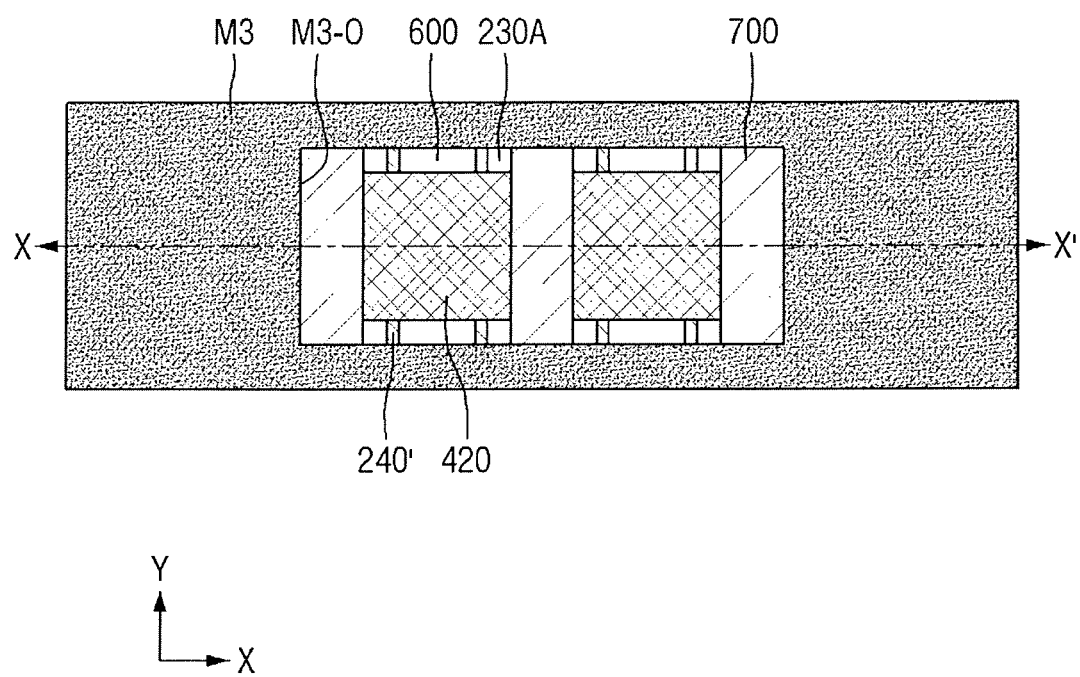
Figure 21B:
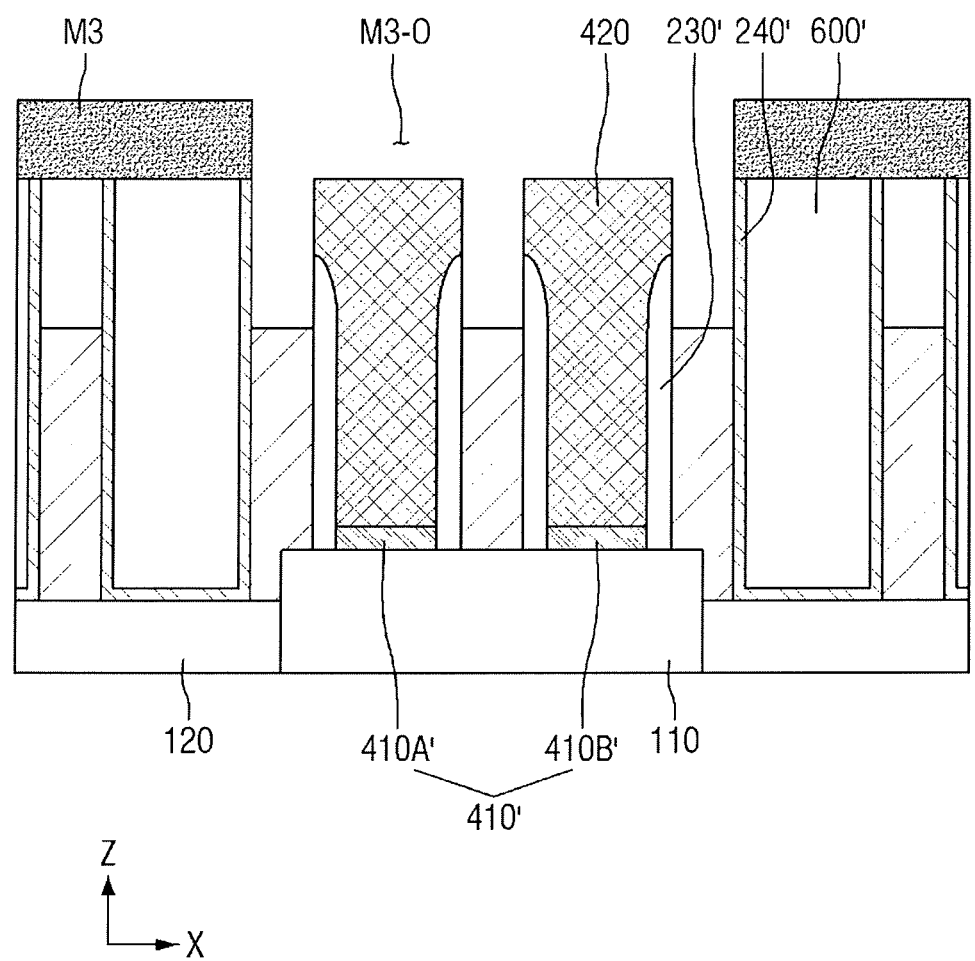
Figure 22A:
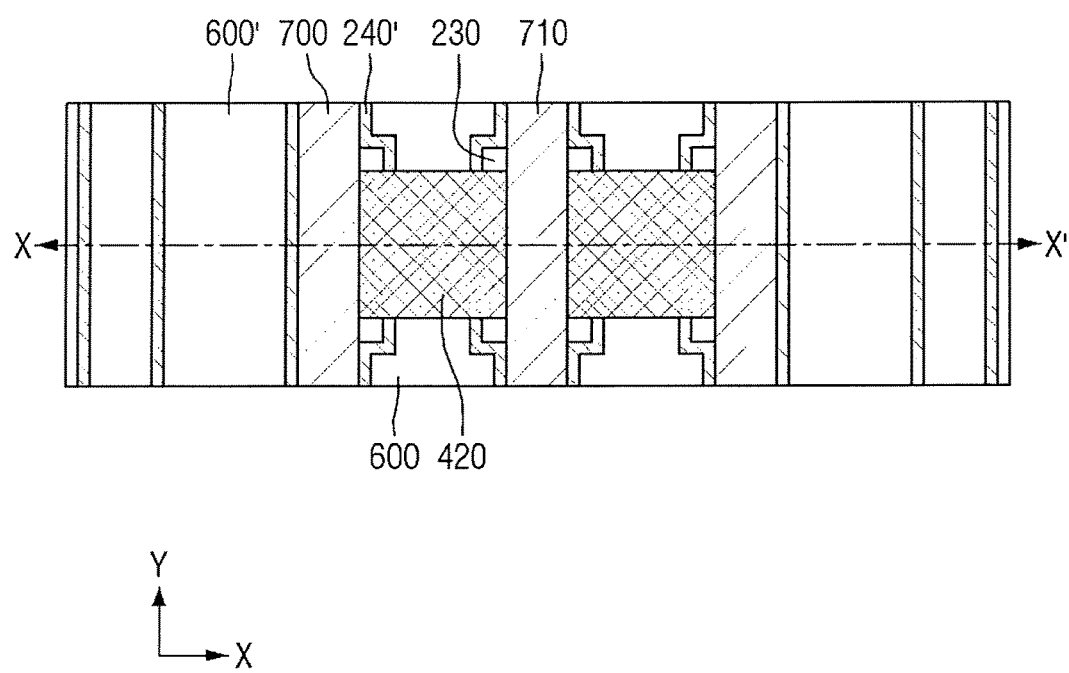
Figure 22B:
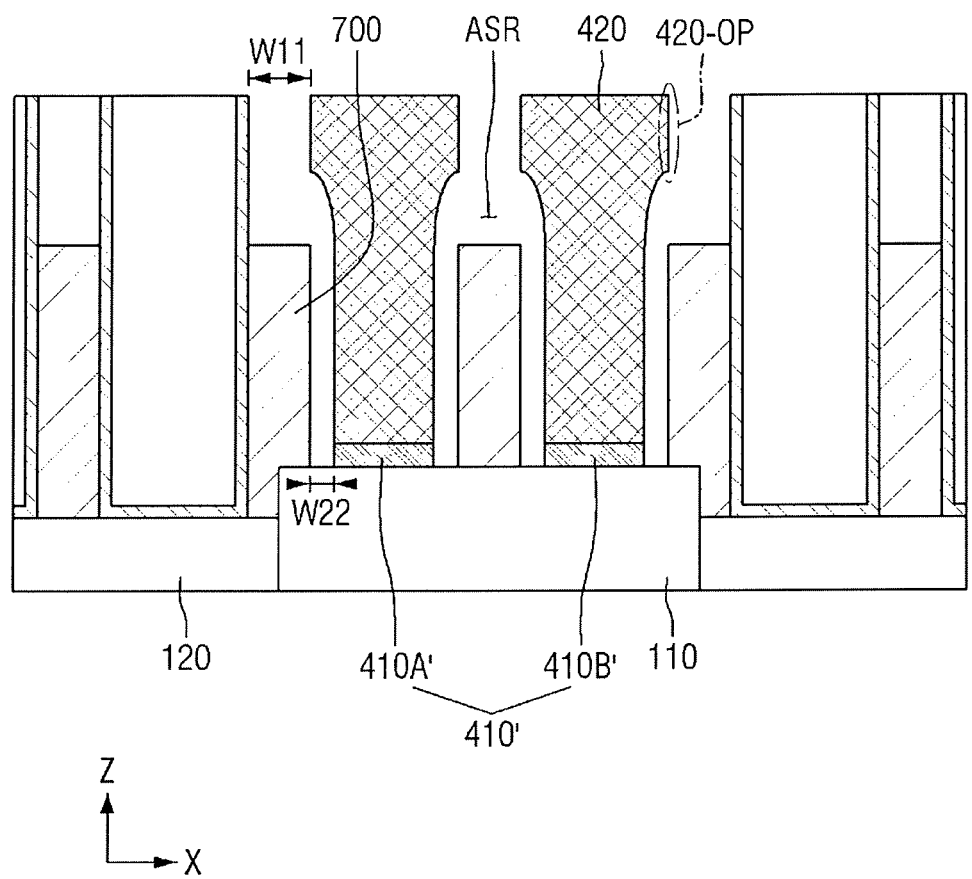

FIGS. 21A and 21B show a third mask M3 having an opening M3-O to define an air spacer region ASR of FIGS. 22A and 22B. In a directional etching process including an RIE process using the third mask M3 as an etch mask, the gate electrode caps 710 of FIG. 20B are removed so that the metal gate electrodes 700 and the gate spacers 230' are exposed.

After the removing of the gate electrode caps 710, the gate spacers 230' are removed by an isotropical etching process including a wet etching or a dry etching process. The isotropical etching process may selectively remove the gate spacers 230' with respect to the metal gate electrodes 700 and the source/drain electrodes 420. The isotropical etching process may further selectively remove the gate spacers 230' with respect to the silicide layer 410' and the active fin structure 110.

FIGS. 22A and 22B show the air spacer region ASR after step 600 of FIG. 13 is performed.

The air spacer region ASR includes an upper portion having a width W11 and a lower portion having a width W22. The lower portion having the width W22 is interposed between the metal gate electrode 700 and a lower portion of the source/drain electrode 420. The lower portion of the air spacer region ASR is shadowed by the upper portion of the source/drain electrodes 420. For example, the upper portion of the source/drain electrode 430 includes the overhang part 420-OP. In a deposition process using a chemically-vapor deposition (CVD) process or a spin-on coating process, the lower portion of the air spacer region ASR is not completely filled so that a void is formed within the air spacer region ASR. The upper portion of the air spacer region ASR is completely filled.

FIGS. 23A and 23B shows an air spacer 250 formed after step 700 of FIG. 13 is performed according to an exemplary embodiment of the present inventive concept. Low-k ILD patterns 630 are formed in the air spacer region ASR so that the low-k ILD patterns have voids therein. The low-k ILD patterns fills completely the upper portions of the air spacer region ASR, and fills partially the lower portions of the air spacer region ASR to form the air spacers.

Figure 24:
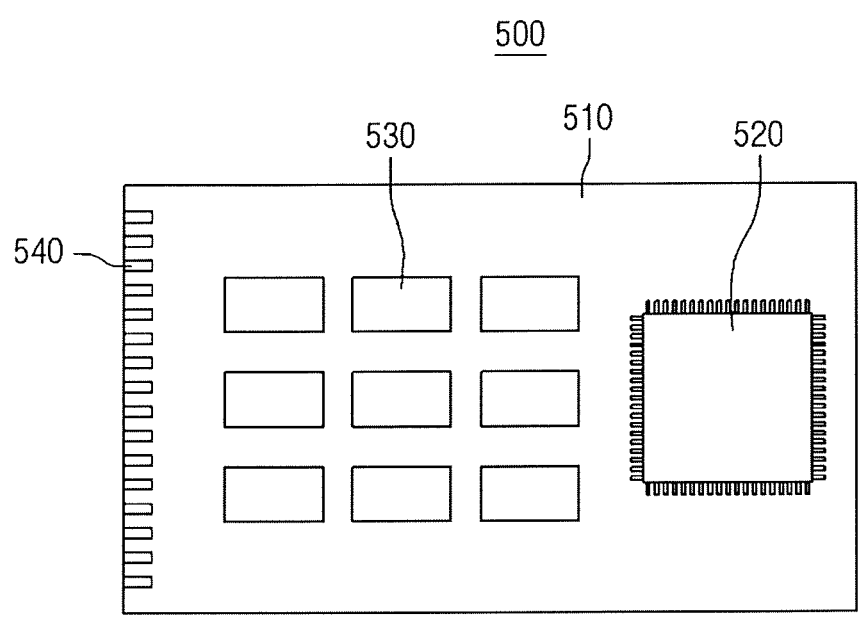
FIG. 24 is a semiconductor module having a semiconductor device fabricated according to an exemplary embodiment of the present inventive concept.

FIG. 24 is a semiconductor module having a semiconductor device fabricated according to an exemplary embodiment of the present inventive concept.

Referring to FIG. 24, the semiconductor module 500 includes a semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 25:
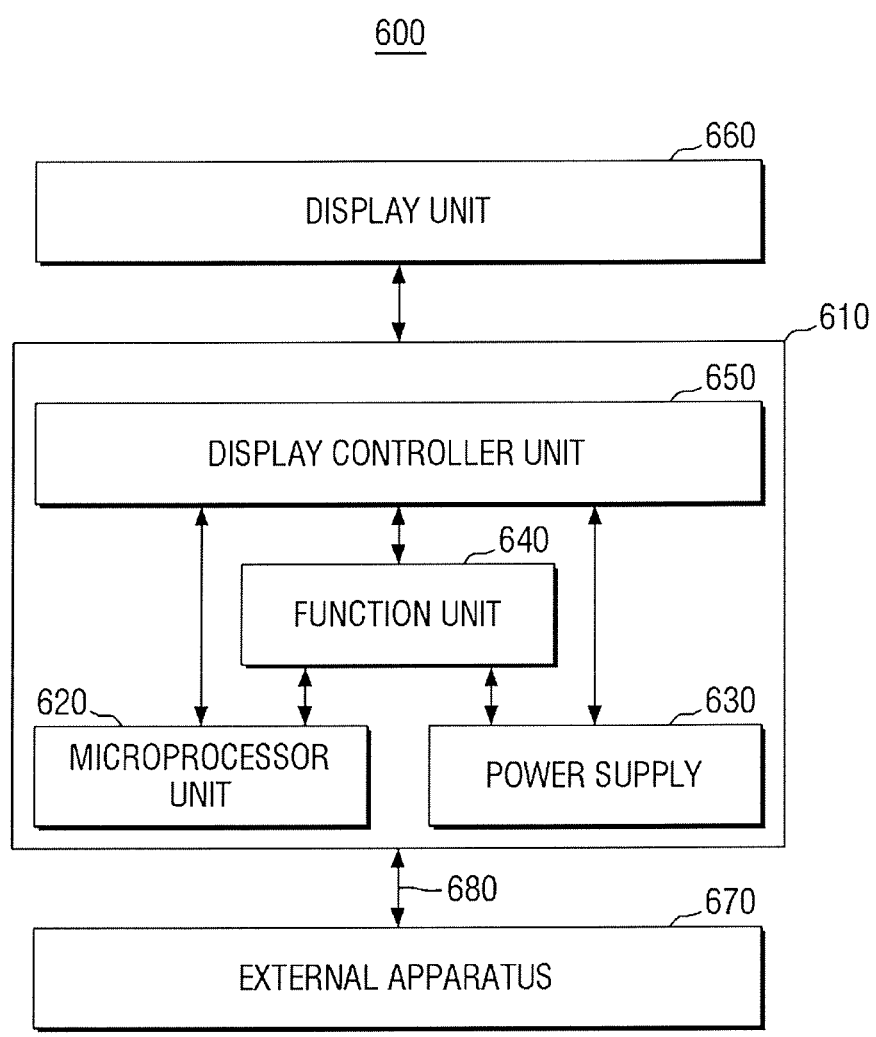
FIG. 25 is a block diagram of an electronic system having a semiconductor device according to an exemplary embodiment of the present inventive concept.

FIG. 25 is a block diagram of an electronic system having a semiconductor device according to an exemplary embodiment of the present inventive concept.

Referring to FIG. 25, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 26:
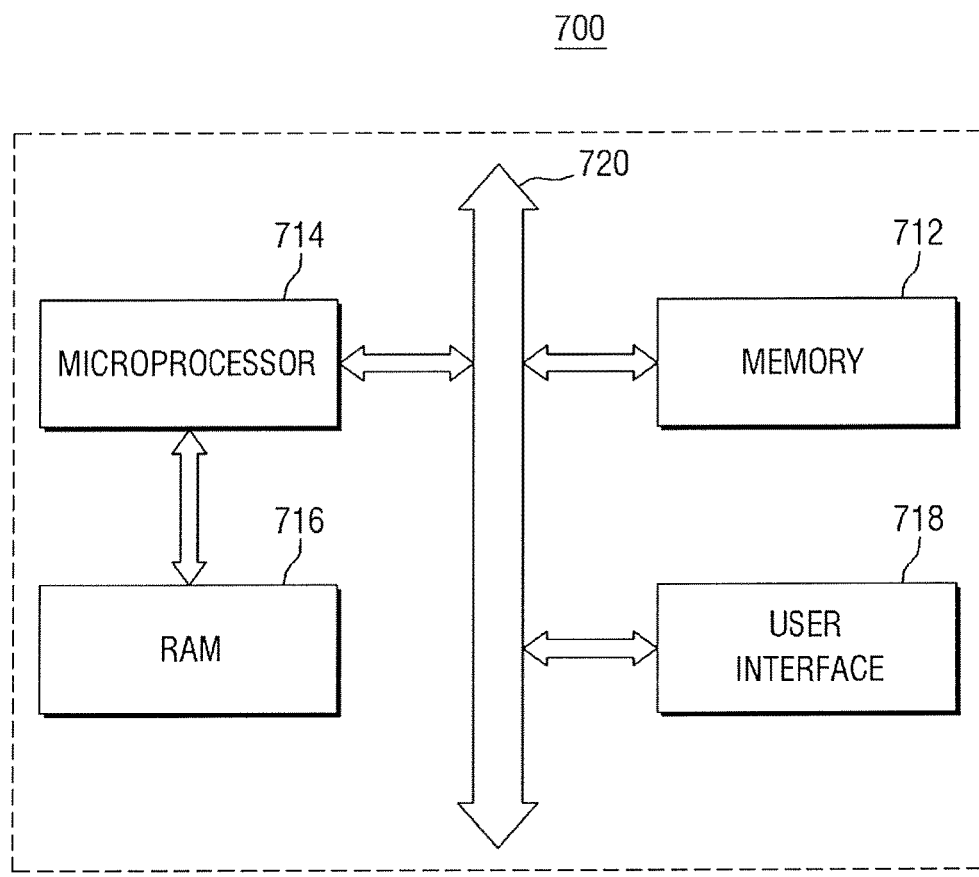
FIG. 26 is a block diagram of an electronic system having a semiconductor device fabricated according to an exemplary embodiment of the present inventive concept.

FIG. 26 is a block diagram of an electronic system having a semiconductor device fabricated according to an exemplary embodiment of the present inventive concept.

Referring to FIG. 26, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
    forming an active fin structure and an isolation region on a substrate;
    forming a plurality of epitaxial layers on the active fin structure;
    forming a plurality of first metal gate electrodes on the active fin structure, wherein each of the first metal gate electrodes and each of the epitaxial layers are alternately disposed in a first direction on the active fin structure;
    forming a plurality of ILD patterns on the plurality of epitaxial layers, wherein each of the plurality of ILD patterns is extended in a second direction crossing the first direction;
    forming a plurality of sacrificial spacer patterns on the plurality of first metal gate electrodes, wherein each of the plurality of sacrificial spacer patterns covers a corresponding first metal gate electrode of the plurality of first metal gate electrodes;
    forming a plurality of self-aligned contact holes and a plurality of sacrificial spacers by removing the plurality of ILD patterns, wherein each of the plurality of self-aligned contact holes exposes a corresponding epitaxial layer disposed under each of the plurality of ILD patterns;
forming a plurality of source/drain electrodes in the plurality of self-aligned contact holes; and
replacing the plurality of sacrificial spacers with a plurality of air spacers.

2. The method of claim 1,
wherein the forming of the plurality of self-aligned contact holes and the plurality of sacrificial spacers includes:
removing partially each of the plurality of sacrificial spacer patterns to form the plurality of sacrificial spacers,
wherein each self-aligned contact hole is defined by two adjacent sacrificial spacer patterns of the plurality of sacrificial spacer patterns, and
wherein each epitaxial layer is interposed between two adjacent sacrificial spacer patterns of the plurality of sacrificial spacer patterns.

3. The method of claim 1,
wherein the replacing of the sacrificial spacers includes:
filling a plurality of low-k ILD patterns in the plurality of self-aligned contact holes,
wherein a dielectric constant of each of the plurality of low-k ILD patterns is smaller than a dielectric constant of each of the plurality of ILD patterns.

4. The method of claim 3, further comprising:
forming a plurality of second metal gate electrodes formed on the isolation region; and
forming a plurality of capping layers on the plurality of second metal gate electrodes,
wherein after the replacing of the plurality of sacrificial spacers, each of the plurality of capping layers is formed of SiBCN, and
wherein each of the plurality of low-k ILD patterns is disposed on a corresponding first metal gate electrode of the plurality of first metal gate electrodes.

5. The method of claim 1,
wherein each of the plurality of air spacers is spaced apart from each other and disposed along the first direction.

6. The method of claim 1,
wherein each of the plurality of sacrificial spacer patterns is formed of SiN, and
wherein each of the plurality of ILD patterns is formed of silicon oxide.

7. The method of claim 1, further comprising:
forming a plurality of second metal gate electrodes formed on the isolation region; and
forming a plurality of capping layers on the plurality of second metal gate electrodes.

8. The method of claim 7,
wherein each of the plurality of capping layers is formed of SiBCN, and
wherein each of the plurality of sacrificial spacers is formed of SiN.

9. The method of claim 7,
wherein each of the plurality of first metal gate electrodes has a round corner, and
wherein each of the second metal gate electrode has a vertex.

10. The method of claim 1,
wherein the forming of the plurality of self-aligned contact holes and the plurality of sacrificial spacers includes:
performing an anisotropic etching process on the plurality of ILD patterns and the plurality of sacrificial spacers.

11. The method of claim 10,
wherein the anisotropic etching process is performed using a mask having a plurality of openings, and
wherein each of the plurality of openings has a width greater than a width of each of the plurality of epitaxial layers.

12. The method of claim 1,
wherein each of the plurality of source/drain electrodes has an overhang part, and
wherein each pair of air spacers of the plurality of air spacers is formed under the overhang part of the each of the source/drain electrodes.

13. The method of claim 1,
wherein each of the plurality of ILD patterns is interposed between two adjacent first metal gate electrodes of the plurality of first metal gate electrodes, and
wherein each of the plurality of ILD patterns is spaced apart from two adjacent first metal gate electrodes.

14. A method of fabricating a semiconductor device,
forming an active fin structure and an isolation region on a substrate;
forming a plurality of first preliminary gate spacers on the isolation region and a plurality of second preliminary gate spacers on the active fin structure;
forming a plurality of epitaxial layers on the active fin structure, wherein each of the plurality of epitaxial layers is interposed between two adjacent second preliminary gate spacers of the plurality of second preliminary gate spacers;
forming a plurality of dummy gate electrodes including a first dummy gate electrode on the isolation region and second and third dummy gate electrodes on the active fin structure, wherein the first dummy gate electrode is interposed between a first pair of the plurality of first preliminary gate spacers, wherein the second dummy gate electrode is interposed between one of a second pair of the plurality of first preliminary gate spacers and one of the plurality of second preliminary gate spacers and wherein the third dummy gate electrode is interposed between a third pair of the plurality of second preliminary gate spacers;
removing the plurality of first preliminary gate spacers;
forming a plurality of gate spacers from the plurality of second preliminary gate spacers; and
replacing the plurality of gate spacers with a plurality of air spacers.

15. The method of claim 14,
wherein the removing of the plurality of first preliminary gate spacers includes:
forming a first mask on the active fin structure, the first mask covering the plurality of second preliminary gate spacers and exposing the plurality of first preliminary gate spacers and
etching the plurality of first preliminary gate spacers using the first mask as an etch mask.

16. The method of claim 14, further comprising:
forming a plurality of first liner patterns on the isolation region, wherein the plurality of first liner patterns is formed on sidewalls of first dummy gate electrode;
forming a plurality of second liner patterns on the active fin structure, wherein the plurality of second liner patterns is formed on sidewalls of the plurality of dummy gate spacers and upper surfaces of the plurality of epitaxial layers;
replacing the plurality of dummy gate electrodes with a plurality of first metal gate electrodes; and replacing the plurality of second dummy gate electrodes with a plurality of second metal gate electrodes.

17. The method of claim 16,
wherein the forming of the plurality of gate spacers from the plurality of second preliminary gate spacers:
performing an anisotropic etching process on the plurality of second preliminary gate spacers and the plurality of second liner patterns, wherein the plurality of second liner patterns protects the plurality of epitaxial layers from the anisotropic etching process; and
after the performing of the anisotropic etching process, removing completely the plurality of second liner patterns to expose the upper surfaces of the plurality of epitaxial layers and to form a plurality of contact holes, wherein each of the plurality of contact holes is defined by two adjacent gate spacers of the plurality of gate spacers.

18. The method of claim 17, further comprising:
forming a plurality of source/drain electrodes in the plurality of contact holes;
forming a plurality of gate electrode caps on the plurality of second metal gate electrodes,
wherein the replacing of the plurality of dummy gate spacers with a plurality of air spacers includes:
removing the plurality of gate electrodes caps using an anisotropic etching process to expose partially sidewalls of the plurality of dummy gate spacers;
after the removing of the plurality of gate electrode caps, removing the plurality of dummy gate spacers using an isotropic etching process to form an air spacer region defined between each of the plurality of second metal gate electrodes and each of the plurality of source/drain electrodes; and
forming each of a plurality of low-k ILD patterns in the air spacer, wherein each of the plurality of low-k ILD patterns includes a void.

19. A semiconductor device, comprising:
a substrate having an active fin structure, wherein the active fin structure is extended in a first direction;
first and second metal gate electrodes disposed on the active fin structure;
a source/drain electrode disposed between the first and second metal gate electrodes and disposed on the active fin structure, wherein an upper surface of the source/drain electrode has a first width and a lower surface of the source/drain electrode has a second width smaller than the first width;
a first air spacer interposed between a first sidewall of the source/drain electrode and the first metal gate electrode; and
a second air spacer interposed between a second sidewall of the source/drain electrode and the second metal gate electrode,
wherein the first air spacer and the second air spacer are extended in a second direction crossing the first direction.

20. The semiconductor device of claim 19,
wherein a width of the first air spacer is substantially equal to or less than a difference between the first width of the source/drain electrode and the second width of the source/drain electrode, and
wherein a length of the first air spacer is greater than a length of the source/drain electrode, and
wherein the width of the first air spacer and the first and second widths of the source/drain electrode are measured along the first direction, and the length of the first air spacer and the length of the source/drain electrode is measured in the second direction.

* * * * *